(12) United States Patent
Kim et al.

(10) Patent No.: US 8,373,261 B2
(45) Date of Patent: Feb. 12, 2013

(54) CHIP STACK PACKAGE AND METHOD OF FABRICATING THE SAME

(75) Inventors: Pyoung-wan Kim, Suwon-si (KR); Min-seung Yoon, Seoul (KR); Nam-seog Kim, Yongin-si (KR); Keum-hee Ma, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 315 days.

(21) Appl. No.: 12/656,322

(22) Filed: Jan. 26, 2010

(65) Prior Publication Data

US 2010/0244233 A1  Sep. 30, 2010

(30) Foreign Application Priority Data

Mar. 31, 2009  (KR) .................. 10-2009-0027755

(51) Int. Cl.
*H01L 23/02* (2006.01)

(52) U.S. Cl. . 257/686; 257/723; 257/693; 257/E23.169; 257/E25.018

(58) Field of Classification Search .............. 257/686, 257/693, E23.169, E25.018, 723
See application file for complete search history.

(56) References Cited

U.S. PATENT DOCUMENTS

| 7,074,703 | B2* | 7/2006 | Fukazawa ............... 438/598 |
| 2001/0010627 | A1* | 8/2001 | Akagawa ................ 361/761 |
| 2005/0280160 | A1* | 12/2005 | Kim et al. ................ 257/777 |
| 2006/0073637 | A1* | 4/2006 | Yokoyama et al. .......... 438/109 |

FOREIGN PATENT DOCUMENTS

| JP | 2004-228393 | 8/2004 |
| JP | 2005-183580 | 7/2005 |
| JP | 2007-250708 | 9/2007 |

* cited by examiner

*Primary Examiner* — Kimberly Rizkallah
*Assistant Examiner* — Timor Karimy
(74) *Attorney, Agent, or Firm* — Harness, Dickey & Pierce, P.L.C.

(57) ABSTRACT

Provided is a chip stack package and a method of manufacturing the same. A chip stack package may include a base chip including a base substrate, a base through via electrode penetrating the base substrate, a base chip pad connected to the base through via electrode, and a base encapsulant. The chip stack package may further include at least one stack chip on a surface of the base substrate. The chip stack package may also include an external connection terminal connected to the base through via electrode and the base chip pad and protruding from the base encapsulant, and an external encapsulant surrounding and protecting outer surfaces of the base chip and the at least one stack chip, wherein the chip through via electrode and the chip pad are connected to the base through via electrode and the base chip pad of the base chip.

15 Claims, 25 Drawing Sheets

CHIP STACK PACKAGE AND METHOD OF FABRICATING THE SAME

CROSS-REFERENCE TO RELATED APPLICATIONS

This application claims priority under 35 U.S.C. §119 to Korean Patent Application No. 10-2009-0027755, filed on Mar. 31, 2009, in the Korean Intellectual Property Office (KIPO), the entire contents of which are herein incorporated by reference.

BACKGROUND

1. Field

Example embodiments relate to a chip stack package and a method of fabricating the same, and more particularly, to a chip stack package formed by stacking a plurality of chips and a method of fabricating the same.

2. Description of the Related Art

Developments in semiconductor industries are in a trend toward low-cost fabrication of multi-functional products that are relatively light, small, fast, efficient, and reliable. Different packaging techniques offer one of the most significant ways to achieve the above-stated goal.

A packaging technique may produce a chip stack package that is formed by stacking a plurality of chips. Because chips are stacked in a chip stack package, density of chip integration may be increased. Furthermore, because different types of chips, e.g., a memory chip and a control chip, may be stacked in a chip stack package, a chip stack package may be used as a system-in package.

A chip stack package may be formed by stacking a plurality of chips on a printed circuit board (PCB) substrate. However, reducing the thickness of a chip stack package that includes a PCB substrate may be difficult due to the thickness of the PCB substrate. Furthermore, it is difficult to reduce cost of fabricating a chip stack package that includes a PCB substrate due to the price of the PCB substrate. Furthermore, in cases where a PCB substrate is defective, a chip stack package using the defective PCB substrate becomes defective even if chips are not defective.

Furthermore, a chip stack package formed by stacking chips on a PCB substrate exhibits performance deterioration due to relatively long lengths of wirings in the PCB substrate and a relatively high moisture absorption rate of the PCB substrate.

SUMMARY

Example embodiments provide a chip stack package which may exhibit improved performance while a thickness and a fabrication cost thereof are reduced.

Example embodiments also provide a method for relatively easy fabrication of the chip stack package.

In accordance with example embodiments, a chip stack package may include a base chip including a base substrate, a base through via electrode penetrating the base substrate, a base chip pad connected to the base through via electrode, and a base encapsulant protecting a first surface of the base substrate. The example chip stack package may further include at least one stack chip on a second surface of the base substrate, the at least one stack chip including a substrate, a chip through via electrode penetrating the substrate, and a chip pad connected to the chip through via electrode. The example chip stack package may also include an adhesive layer between the at least one stack chip and the second surface of the base substrate, an external connection terminal connected to the base through via electrode and the base chip pad and protruding from the base encapsulant, and an external encapsulant surrounding and protecting outer surfaces of the base chip and the at least one stack chip, wherein the chip through via electrode and the chip pad are connected to the base through via electrode and the base chip pad of the base chip.

In accordance with example embodiments, a method of fabricating a chip stack package may include forming at least one base chip at a wafer level, the at least one base chip including a base substrate, a base through via electrode penetrating the base substrate, a base chip pad connected to the base through via electrode, and a base encapsulant protecting a first surface of the base substrate. The example method may also include the operations of attaching and reconfiguring the at least one base chip on a wafer carrier by adhering the base encapsulant of the at least one base chip to the wafer carrier via an adhesive layer between the base encapsulant and the wafer carrier, adhering at least one stack chip to the at least one base chip using an adhesive layer between the at least one stack chip and the at least one base chip. The at least one stack chip may include a chip through via electrode and a chip pad connected to the chip through via electrode. The example method may also include the operations of forming an external encapsulant to protect outer surfaces of the at least one base chip and the at least one stack chip, removing the at least one base chip and the at least one stack chip from the wafer carrier, forming at least one external connection terminal at the wafer level connecting to the at least one base chip so that the at least one external connection terminal contacts the base through via electrode and the base chip pad of the at least one base chip, and dicing the external encapsulant at the wafer level to fabricate individual stack chip packages, wherein the chip through via electrode and the chip pad of the at least one stack chip are connected to the base through via electrode and the base chip pad of the at least one base chip.

According to example embodiments, there is provided a chip stack package including a base chip, which includes a base substrate, a base through via electrode penetrating the base substrate, a base chip pad connected to the base through via electrode, and a base encapsulant protecting a first surface of the base substrate, a plurality of stack chips that are attached onto a second surface of the base substrate, wherein an adhesive layer is interposed between the stack chips and the second surface of the base substrate, the individual stack chip includes a substrate, a chip through via electrode that penetrates the substrate, and a chip pad that is connected to the chip through via electrode, and the chip through via electrode and the chip pad are connected to the base through via electrode and the base chip pad of the base chip, an external connection terminal that is connected to the base through via electrode and the base chip pad and protrudes from the base encapsulant, and an external encapsulant that surrounds and protects outer surfaces of the base chip and the stack chips.

A heterogeneous chip that is a different type of chip from the stack chips may be further attached onto a first surface of the base chip, and the base encapsulant may be formed to protect the heterogeneous chip and the first substrate. The external connection terminal may include a first external connection terminal that is formed in the base encapsulant and a second external connection terminal that is connected to the first external connection terminal and protrudes from the base encapsulant.

The base substrate and the substrate may be formed of a silicon substrate on which integrated circuits are formed. The base chip pad may be a redistribution chip pad. In the base chip, the base chip pad may be formed on the first surface of the base substrate and the base through via electrode may protrude from the second surface of the base substrate. The individual stack chip may include a chip pad on a first surface of the substrate, and the chip pad formed on the first surface of the substrate may be connected to the base through via electrode protruding from the second surface of the base substrate.

In the base chip, the base chip pad may be formed on the second surface of the base substrate and the base through via electrode may protrude from the first surface of the base substrate. The individual stack chip may include a chip pad on a first surface of the substrate, and the chip pad formed on the first surface of the substrate may be connected to the base chip pad formed on the second surface of the base substrate. A redistribution layer may be formed and connected to the base through via electrode formed on the first surface of the base substrate, and the external connection terminal may be connected to the redistribution layer.

A hole exposing the base chip pad may be formed in the base encapsulant, and an external connection terminal may be formed in the hole.

According to example embodiments, there is provided a chip stack package including a base chip, which includes a base substrate having an active surface and a non-active surface, a base chip pad formed on the active surface, a base encapsulant protecting the active surface of the base substrate, and a base through via electrode that penetrates the base substrate, is connected to the base chip pad, and protrudes from the non-active surface, a plurality of stack chips that are attached onto the non-active surface of the base substrate, wherein an adhesive layer is interposed between the stack chips and the non-active surface of the base substrate, and the individual stack chip includes a substrate, a chip pad that is formed on an active surface of the substrate and is connected to the base through via electrode of the base chip, and a chip through via electrode that penetrates the substrate, is connected to the chip pad, and protrudes from a non-active surface of the substrate, an external connection terminal that is connected to the base chip pad and protrudes from the base encapsulant, and an external encapsulant that surrounds and protects outer surfaces of the base chip and the stack chips.

A heterogeneous chip that is a different type of chip from the stack chips may be attached onto the active surface of the base substrate and the base encapsulant may be formed to protect the heterogeneous chip.

According to example embodiments, there is provided a method of fabricating a chip stack package, the method including forming a plurality of base chips at the wafer level, each of which includes a base through via electrode penetrating a base substrate, a base chip pad connected to the base through via electrode, and a base encapsulant protecting a first surface of the base substrate, individually attaching and reconfiguring the plurality of base chips on a wafer carrier, wherein the base encapsulant includes a surface attached to the wafer carrier, and an adhesive layer is interposed between the base encapsulant and the wafer carrier, stacking a plurality of stack chips on the base chips that are reconfigured on the wafer carrier, wherein an adhesive layer is interposed between the stack chips and the base chips, the individual stack chip includes a chip through via electrode and a chip pad that is connected to the chip through via electrode, and the chip through via electrode and the chip pad are connected to the base through via electrode and the base chip pad of the base chip, forming an external encapsulant to protect outer surfaces of the base chip and the stack chips, removing the base chip and the stack chips on which the external encapsulant is formed from the wafer carrier, forming an external connection terminal at the wafer level connected to the base through via electrode and the base chip pad, and dicing the external encapsulant at the wafer level to fabricate individual stack chip packages.

The formation of the plurality of base chips includes forming the base through via electrode and the base chip pad that is connected to the base through via electrode at the wafer level, forming the base encapsulant at the wafer level to protect the base chip pad, forming the base through via electrode to partially protrude from the base encapsulant by etching a second surface of the base substrate, and fabricating individual base chips by dicing the base substrate and the base encapsulant at the wafer level.

A first external connection terminal may be formed on the base chip pad before the base encapsulant is formed, and the first external connection terminal and the base encapsulant may be polished and planarized after the base encapsulant is formed. The external connection terminal may be formed by forming a second external connection terminal on the first external connection terminal after the base chip and the stack chips are removed, on which the external encapsulant is formed, from the wafer carrier.

A heterogeneous chip that is a different type of chip from the stack chips may be attached onto the base chip at the wafer level before the base encapsulant is formed. When the plurality of base chips are reconfigured on the wafer carrier, a first surface of the base encapsulant may be a surface attached to the wafer carrier, and the base through via electrode partially may protrude from a second surface of the base encapsulant.

When the plurality of base chips are reconfigured on the wafer carrier, a first surface of the base encapsulant may be a surface attached to the wafer carrier, and the base chip pad may protrude from a second surface of the base encapsulant. The external connection terminal may be formed by forming a hole that exposes the base chip pad by etching the base encapsulant at the wafer level and forming a solder ball in the hole.

The formation of the plurality of base chips includes forming the base through via electrode and the base chip pad that is connected to the base through via electrode at the wafer level, forming the base through via electrode to partially protrude from the base encapsulant by etching a second surface of the base substrate at the wafer level, flipping the base substrate over and forming a redistribution layer connected to the base through via electrode, forming a heterogeneous chip that is a different type of chip from the stack chips on the base through via electrode at the wafer level, wherein an adhesive layer is interposed between the heterogeneous chip and the base through via electrode, forming the base encapsulant at the wafer level to protect the heterogeneous chip and the redistribution layer, and fabricating individual base chips by dicing the base substrate and the base encapsulant at the wafer level.

The external connection terminal may be formed by forming a hole that exposes the redistribution layer by etching the base encapsulant at the wafer level and forming a solder ball in the hole.

According to example embodiments, there is provided a method of fabricating a chip stack package, the method including forming a plurality of base chips at the wafer level, each of which includes a base through via electrode that penetrates a base substrate and protrudes outward, a base chip pad that is connected to the base through via electrode and is formed on an active surface of the base substrate, and a base encapsulant protecting the base chip pad, individually attaching and reconfiguring the plurality of base chips on a wafer carrier, wherein the base encapsulant is a surface attached to the wafer carrier, and an adhesive layer is interposed between the base encapsulant and the wafer carrier, stacking a plurality of stack chips on the base chips that are reconfigured on the wafer carrier, wherein an adhesive layer is interposed between the stack chips and the base chips, and the individual stack chip includes a substrate, a chip pad that is formed on the substrate and is connected to the base through via electrode, and a chip through via electrode, forming an external encapsulant to protect the outer surfaces of the base chip and the stack chips, removing the base chip and the stack chips, on which the external encapsulant is formed, from the wafer carrier, forming an external connection terminal at the wafer level that is connected to the base chip pad by etching the base encapsulant, and dicing the external encapsulant at the wafer level to fabricate individual stack chip packages.

The stack chips are attached to the non-active surface of the base substrate. When the base chip is formed, a heterogeneous chip that is a different type of chip from the stack chips may be further attached onto the active surface of the base substrate at the wafer level, and an adhesive layer is interposed between the heterogeneous chip and the active surface of the base substrate.

BRIEF DESCRIPTION OF THE DRAWINGS

Example embodiments will be more clearly understood from the following detailed description taken in conjunction with the accompanying drawings.

FIG. 1 is a cross-sectional view of a chip stack package according to example embodiments;

FIG. 2 is a cross-sectional view of a chip stack package according to example embodiments;

FIGS. 3 through 12 are cross-sectional views of a method of fabricating the chip stack package as shown in FIG. 1;

FIGS. 13 through 20 are cross-sectional views of a method of fabricating the chip stack package as shown in FIG. 2;

FIG. 21 is a cross-sectional view of a chip stack package according to example embodiments;

FIG. 22 is a cross-sectional view of a chip stack package according to example embodiments;

FIGS. 23 through 29 are cross-sectional views of a method of fabricating a chip stack package as shown in FIG. 21;

FIGS. 30 through 36 are cross-sectional views of a method of fabricating the chip stack package as shown in FIG. 22;

FIG. 37 is a concept view showing the configuration of a package module using a chip stack package according to example embodiments;

FIG. 38 is a concept view showing the configuration of a card using a chip stack package according to example embodiments; and FIG. 39 is a concept view of an electronic system using a chip stack package according to example embodiments.

DETAILED DESCRIPTION

Figure 1:
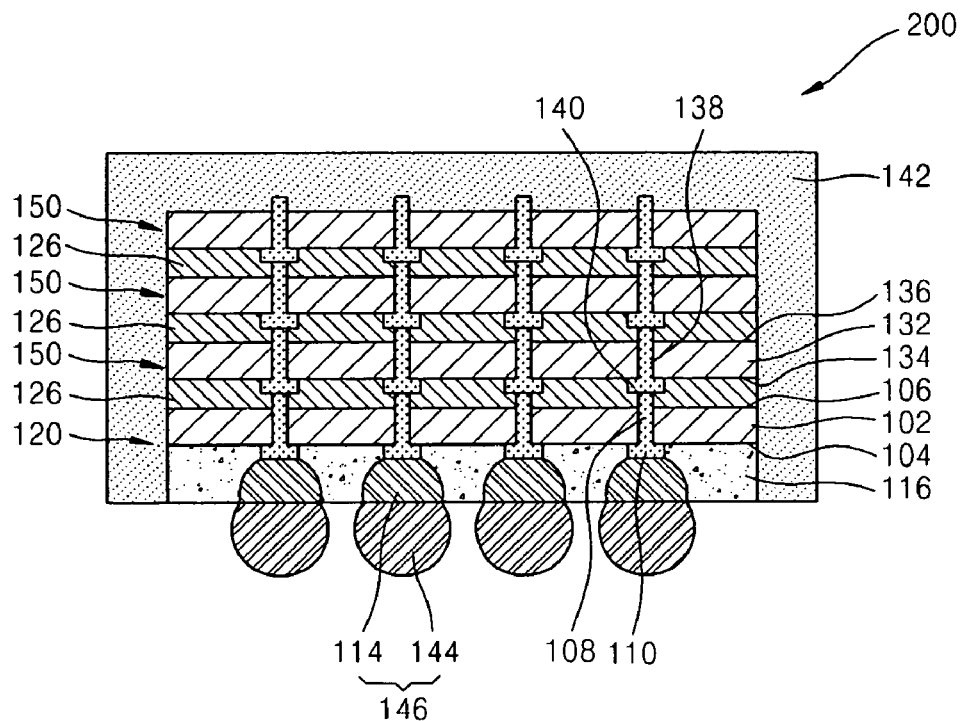
FIGS. 1-39 represent non-limiting, example embodiments as described herein.

A chip stack package according to example embodiments does not employ a printed circuit board (PCB) substrate, but employs a base substrate that constitutes a base chip at the bottom most of stacked chips as a wiring substrate. In example embodiments, an adhesive layer that normally connects a PCB substrate having a thickness of approximately 0.1 mm to approximately 0.5 mm and chips having a thickness from approximately 20 μm to approximately 100 μM, may be omitted, and thus the overall thickness (or height) of a chip stack package according to example embodiments may be reduced by approximately 0.15 mm to approximately 0.40 mm as compared to a chip stack package employing a PCB substrate. Particularly, a chip stack package according to example embodiments may eliminate costs by not using a PCB substrate or an adhesive layer, costs of which constitute a major portion of the overall cost of fabricating a chip stack package, and thus the overall cost of manufacturing a chip stack package may be significantly reduced or minimized.

In addition, because a chip stack package according to example embodiments does not employ a PCB substrate, a chip stack package according to example embodiments can prevent or reduce performance deterioration due to relatively long wirings in a PCB substrate, and a relatively high moisture absorption rate in a PCB substrate.

A chip stack package according to example embodiments may interconnect chips by using a through via electrode that penetrates a substrate. In cases where the substrate is a silicon substrate, a through via electrode may also be referred as a through silicon via.

In cases where chips that form a chip stack package according to example embodiments are interconnected via a through via electrode, the entire fabrication process can be performed at the wafer level. In example embodiments, fabrication processes performed at the wafer level may include a fabrication process performed at the wafer level and a fabricating process performed after cutting the wafer into either individual base chips or individual chips and rearranging either the individual base chips or the individual chips on a supporting substrate having the same size as the wafer.

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete.

While example embodiments will be described in embodiments below, anything not described may be well known to those in the art. In the drawings, the thicknesses of layers and regions are exaggerated for clarity. Like reference numerals in the drawings denote like elements, and thus their description will be omitted. Example embodiments below may be either embodied as a single embodiment or embodied as a combination of a plurality of embodiments.

FIG. 1 is a cross-sectional view of a chip stack package 200 according to example embodiments.

Particularly, the chip stack package 200 according to example embodiments includes a base chip 120. The base chip 120 includes a base substrate 102, a base chip pad 110, a base through via electrode 108, and a base encapsulant 116. The base substrate 102 includes an active surface 104, on which an integrated circuit may be formed, and a non-active surface 106, on which no integrated circuit is to be formed, and may be used as a wiring substrate. The base substrate 102 may be formed of a silicon substrate.

The base through via electrode 108 may be formed in the base substrate 102, and the base through via electrode 108 may be connected to the base chip pad 110. The base chip pad 110 and the base through via electrode 108 may be formed of metal layers, e.g., aluminium layers or copper layers. The base chip pad 110 may be a redistribution (or rewiring) pad using a redistribution layer (not shown) formed on the base substrate 102. The base encapsulant 116 according to example embodiments may protect a first surface of the base substrate 102, e.g., the active surface 104. The base encapsulant 116 may protect the base chip pad 110 formed on the active surface 104 of the base substrate 102.

In the base chip 120, the first surface, e.g., the active surface 104, of the base substrate 102 may face downward, and the base encapsulant 116, which may be formed below the base substrate 102, may support the base substrate 102. The base chip pad 110 may be formed on the first surface, e.g., the active surface 104, of the base substrate 102, and the base through via electrode 108 may be formed on and protrude from a second surface, e.g., the non-active surface 106, of the base substrate 102.

At least one stack chip 150, e.g., three stack chips 150, may be attached to the second surface, e.g., the non-active surface 106, of the base substrate 102, wherein adhesive layers 126 may be interposed therebetween. The at least one stack chip 150 (each of the stack chips 150) may include a substrate 132 having an active surface 134, on which an integrated circuit may be formed, and a non-active surface 136, on which no integrated circuit is to be formed. The substrate 132 may be formed of a silicon substrate. The at least one stack chip 150 may include a chip through via electrode 138 that may penetrate the substrate 132 and a chip pad 140 that may be connected to the chip through via electrode 138. In the at least one stack chip 150, the active surface 134 may face downward and the chip pad 140 may be directly connected to the base through via electrode 108 of the base chip 120.

The chip pad 140 may be formed on a first surface, e.g., the active surface 134, of the substrate 132 and may be connected to the base through via electrode 108, which may be formed on and protrude from the second surface of the base substrate 102. Accordingly, the chip through via electrode 138 and the chip pad 140 may be connected to the base through via electrode 108 and the base chip pad 110.

A first external connection terminal 114, e.g., a solder ball, may be formed in the base encapsulant 116. A second external connection terminal 144, e.g., a solder ball, may be connected to the first external connection terminal 114, and the second external connection terminal 144 may protrude off of the base encapsulant 116. The first external connection terminal 114 and the second external connection terminal 144 may form an external connection terminal 146. The external connection terminal 146 may be electrically connected to the base chip pad 110.

An external encapsulant 142 may be formed on the outer surfaces of the base chip 120 and the stack chips 150. For example, the external encapsulant 142 may be formed to surround and protect the base chip 120 and the stack chips 150. The external encapsulant 142 may be formed to surround outer surfaces of the base chip 120 and the stack chips 150 but not the surface on which the base encapsulant 116 may be formed.

As described above, the chip stack package 200 according to example embodiments does not employ a PCB substrate, but instead may employ the base substrate 102, which may constitute the base chip 120 at the bottom of stacked chips, as a wiring substrate. Furthermore, in the chip stack package 200 according to example embodiments, the stack chips 150 may be stacked on the base chip 120, and the stack chips 150 may be electrically interconnected via the chip through via electrodes 138 that may penetrate the substrates 132. Therefore, as compared to a chip stack package employing a PCB substrate, the chip stack package 200 according to example embodiments may significantly reduce fabrication cost and may exhibit improved performance.

Figure 2:
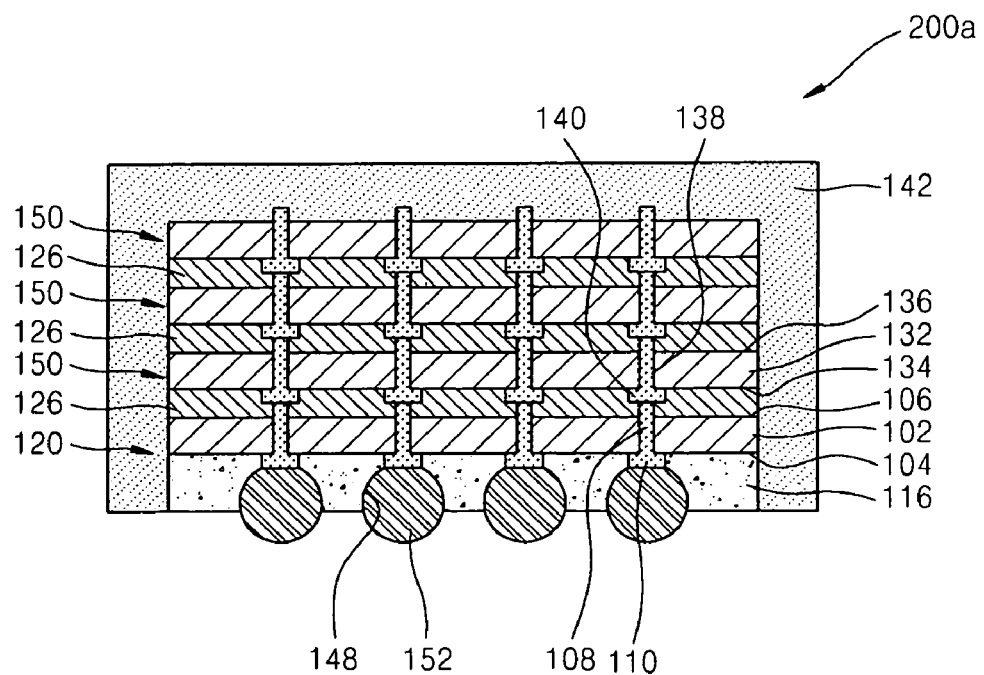

FIG. 2 is a cross-sectional view of a chip stack package 200a according to example embodiments.

Particularly, the chip stack package 200a is identical to the chip stack package 200 shown in FIG. 1 except the structure of an external connection terminal 152.

In the chip stack package 200a, a hole 148 exposing the base chip pad 110 may be formed in the base encapsulant 116, and the external connection terminal 152 may be connected to the base chip pad 110 in the hole 148 and may protrude from the base encapsulant 116. Therefore, compared to the previous embodiment shown in FIG. 1, the external connection terminal 152 is formed of one solder ball in the chip stack package 200a. The chip stack package 200a according to example embodiments will be described in further detail below.

FIGS. 3 through 12 are cross-sectional views of a method of fabricating the chip stack package 200 as shown in FIG. 1.

Figure 3:
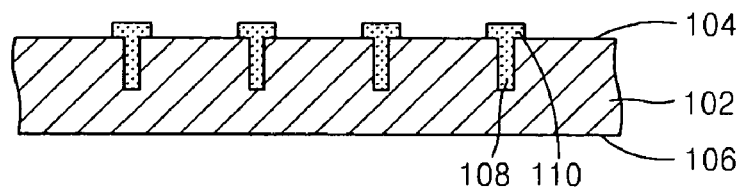

Referring to FIG. 3, the base substrate 102 which may have an active surface 104 on which an integrated circuit may be formed, and the non-active surface 106, on which no integrated surface is to be formed, is prepared. FIG. 3 shows the base substrate 102 at the wafer level. The base substrate 102 may be formed of a silicon substrate, that is, a silicon wafer. The base through via electrode 108 and the base chip pad 110 may be connected to the base through via electrode 108 formed in the base substrate 102.

In FIG. 3, the base through via electrode 108 may only partially penetrate the base substrate 102, and may completely penetrate the base substrate 102 in a later operation. The base through via electrode 108 may be formed of a metal layer, e.g., an aluminium layer or a copper layer.

The base chip pad 110 may be either simultaneously formed with the base through via electrode 108 or not formed simultaneously with the base through via electrode 108. Similar to the base through via electrode 108, the base chip pad 110 may also be formed of a metal layer, e.g., an aluminium layer or a copper layer. The base chip pad 110 may be a redistribution pad using a redistribution layer (not shown) formed on the base substrate 102.

Figure 4:
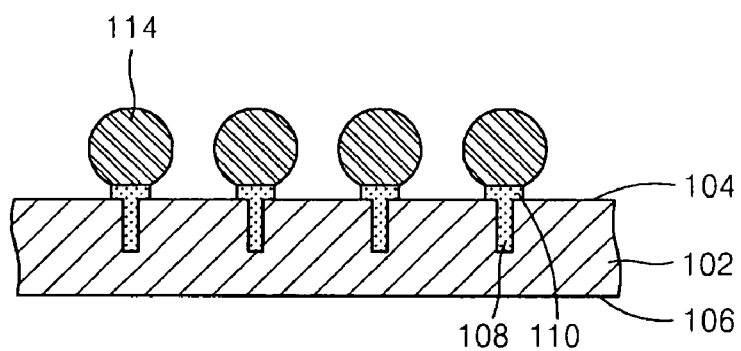
Figure 5:
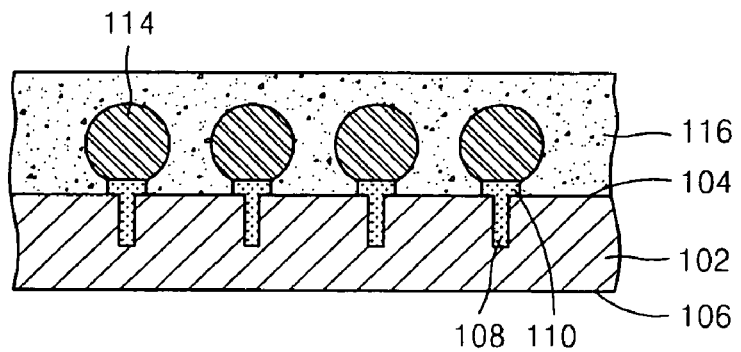

Referring to FIGS. 4 and 5, the first external connection terminal 114 may be formed on the base chip pad 110. The first external connection terminal 114 may be formed of a solder ball. The base encapsulant 116, which may protect the active surface 104 of the base substrate 102, the base chip pad 110, and the first external connection terminal 114, may be formed. In cases where the base encapsulant 116 is formed, the structure may become more heat-resistant and may be handled easier in the following process. Thus, the following operations may be performed more easily.

The base encapsulant 116 may be formed using various molding methods, e.g., a method of injecting liquefied resin into a mold and solidifying the liquefied resin, a method of laminating film type resin and solidifying the film type resin, or a method of spraying resin and solidifying the sprayed resin.

Figure 6:
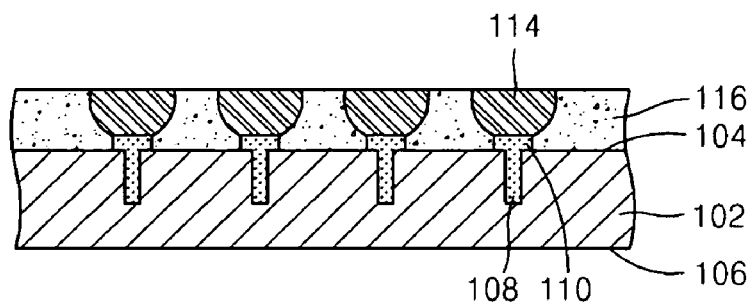
Figure 7:
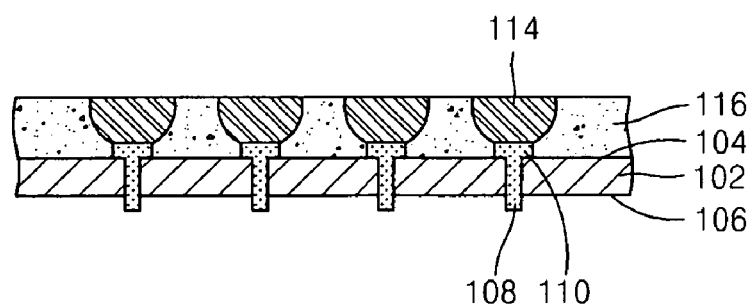

Referring to FIGS. 6 and 7, the first external connection terminal 114 and the base encapsulant 116 may be polished and planarized as shown in FIG. 6. The reason for polishing and planarizing the first external connection terminal 114 and the base encapsulant 116 is to secure reliability for an operation of etching a rear surface of the base substrate 102, that is, the non-active surface 106, to reduce the thickness of the base substrate 102.

As shown in FIG. 7, the rear surface of the base substrate 102, that is, the non-active surface 106, may be etched to reduce the thickness of the base substrate 102 at the wafer level. As a result, the base through via electrode 108 may protrude from the rear surface of the base substrate 102. In FIGS. 1 through 7, break lines at left and right sides indicate that the structures shown in FIGS. 1 through 7 are at the wafer level.

Figure 8:
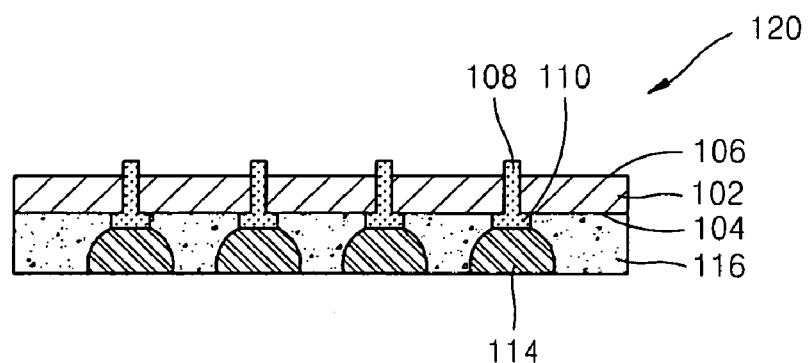

Referring to FIG. 8, a plurality of the base chips 120 may be prepared by dicing the base substrate 102 and the base encapsulant 116 at the wafer level, wherein the exposed surface of the base encapsulant 116 faces downward. In other words, a singulation process of forming the individual base chips 120 by dicing the base substrate 102 and the base encapsulant 116 that are formed as a wafer may be performed. In the base chip 120 of FIG. 8, the non-active surface 106 faces upward. For convenience of explanation, only one base chip 120 is shown in FIG. 8.

Figure 9:
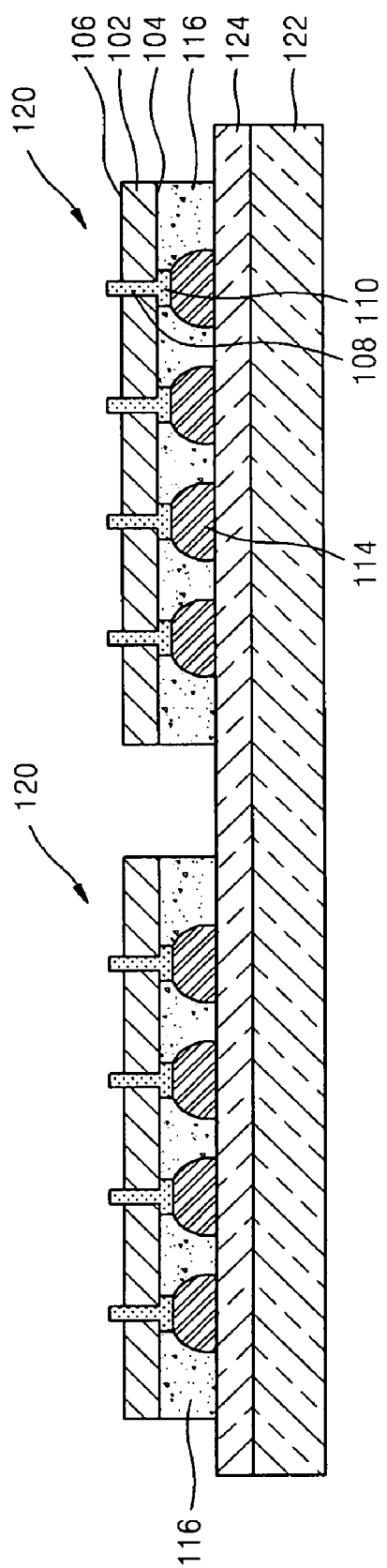

Referring to FIG. 9, the base chips 120 may be individually attached onto and reconfigured on a wafer carrier 122, wherein surfaces of the base encapsulants 116 of the base chips 120 may be attached to the wafer carrier 122, and an adhesive layer 124 may be interposed between the base encapsulants 116 and the wafer carrier 122. The base chips 120 may be reconfigured on the wafer carrier 122, which may have the same size as a wafer, so that stack chips may be easily stacked in a later operation.

Figure 10:
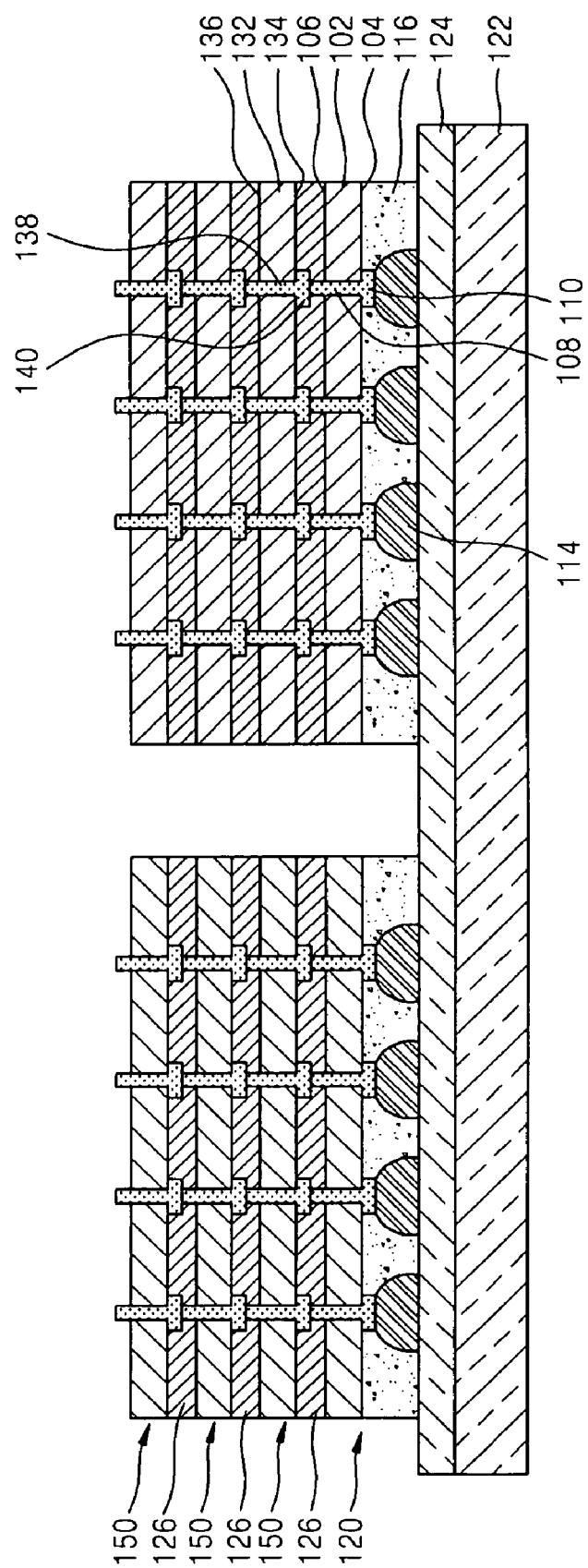

Referring to FIG. 10, a plurality of stack chips 150 may be attached to the base chips 120 reconfigured on the wafer carrier 122 at the wafer level, wherein adhesive layers 126 are interposed between the stack chips 150 and the base chips 120 and between the stack chips 150. For convenience of explanation, FIG. 10 shows an example in which only three stack chips 150 are stacked on each base chip 120. The stack chips 150 may be attached either by stacking the stack chips 150 on the base chips 120 and injecting the adhesive layers 126, for example, resin, therebetween or by preparing the adhesive layers 126 first and attaching the stack chips 150 thereto.

The individual stack chip 150 may include the chip pad 140 and the chip through via electrode 138, which may penetrate the substrate 132 and may be connected to the chip pad 140. The substrate 132 may constituting the individual stack chip 150 may include an active surface 134, on which an integrated circuit may be formed, and the non-active surface 136, on which no integrated circuit is to be formed. In the stack chips 150, the chip pad 140 may be formed on the active surface 134 of the substrate 132, and the chip through via electrode 138 may be formed to protrude from the non-active surface 136.

Therefore, as described above, when the stack chips 150 are stacked on the wafer carrier 122, the base through via electrode 108 of the base chip 120 and the chip pad 140 of the stack chips 150 may be connected. In other words, the individual stack chip 150 may include the chip pad 140 that may be connected to the base through via electrode 108, and may include the chip though via electrode 138 connected to the chip pad 140.

Figure 11:
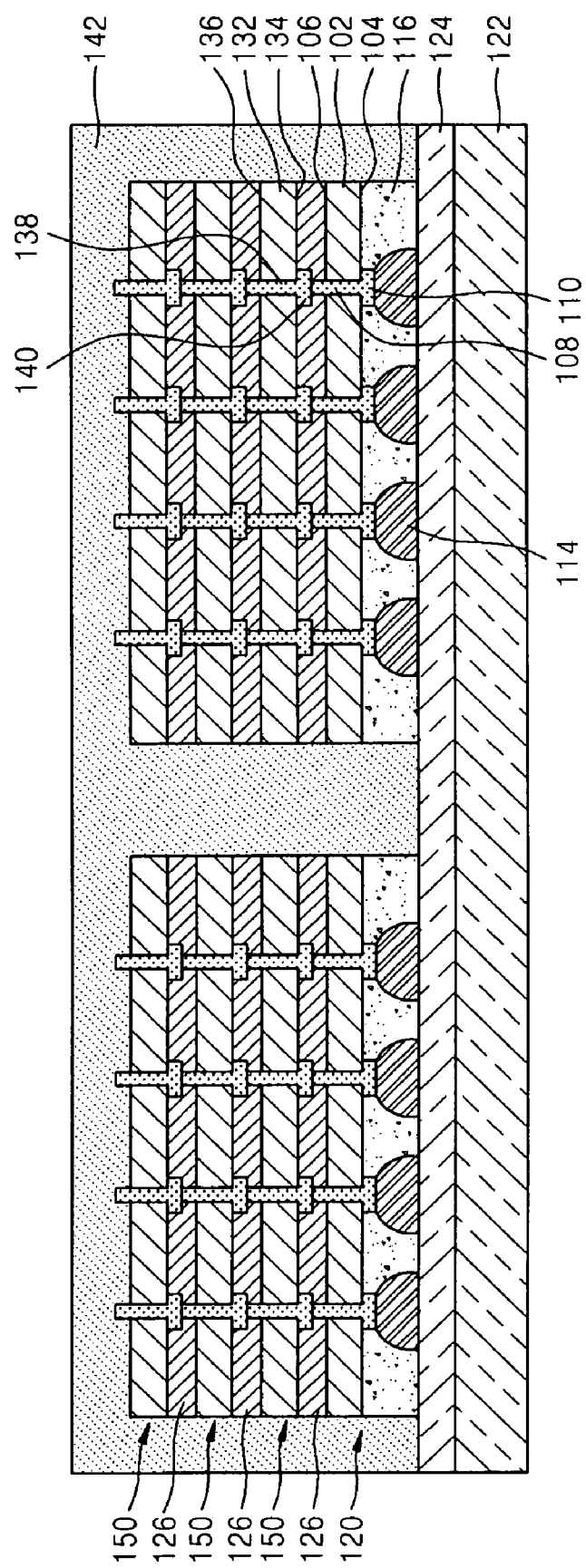

Referring to FIG. 11, the external encapsulant 142 may be formed to protect the base chip 120 and the stack chips 150 that may be formed on the wafer carrier 122. The external encapsulant 142 may be formed using various molding methods as mentioned in the above description regarding the formation of the base encapsulant 116.

Figure 12:
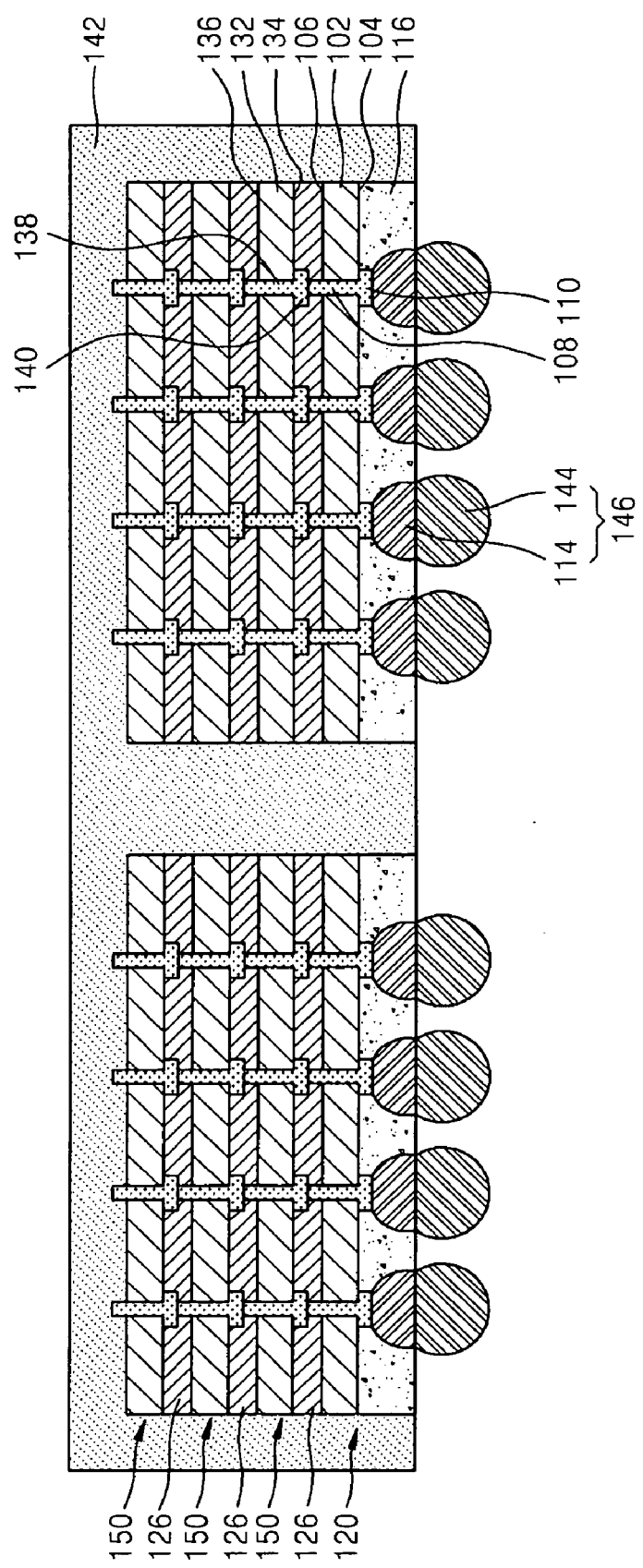

Referring to FIG. 12, the base chip 120 and the stack chips 150 which may be surrounded by the external encapsulant 142 may be removed from the wafer carrier 122 by removing the adhesive layer 124. A solder ball may be formed on the first external connection terminal 114, which may be connected to the base chip pad 110, at the wafer level, and thus the second external connection terminal 144 may be formed. Therefore, the external connection terminal 146 may be formed to have the first external connection terminal 114 and the second external connection terminal 144 connected the first external connection terminal 114. As shown in FIG. 1, the external encapsulant 142 may be diced at the wafer level to fabricate the chip stack package 200.

FIGS. 13 through 20 are cross-sectional views of a method of fabricating a chip stack package as shown in FIG. 2.

Figure 13:
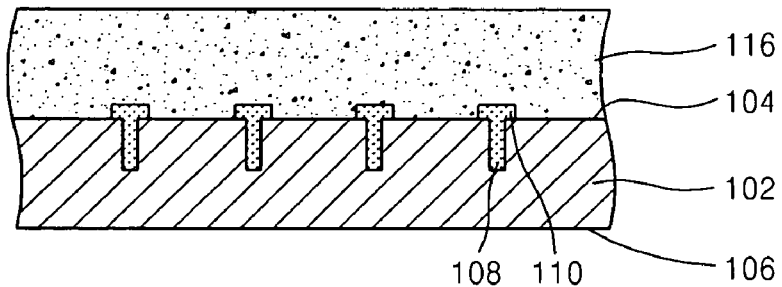
Figure 14:
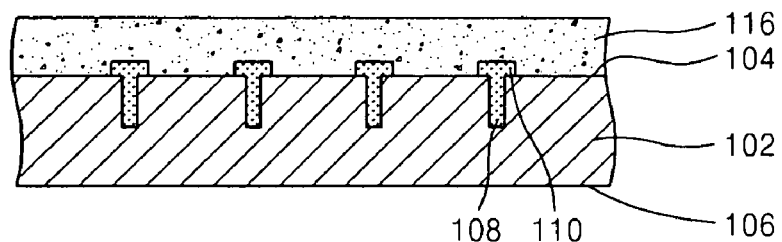

Referring to FIGS. 13 and 14, as described above regarding FIG. 3, the base through via electrode 108 and the base chip pad 110 may be connected. The base through via electrode 108 and the base chip pad 110 may be formed on the base substrate 102 that may have the active surface 104, on which an integrated circuit may be formed, and a non-active surface 106, on which no integrated surface is to be formed. The base substrate 102 shown in FIG. 13 may be a substrate at the wafer level, that is, a wafer before being diced.

A base encapsulant 116 may be formed to protect the active surface 104 of the base substrate 102 and the base chip pad 110. In cases where the base encapsulant 116 is formed, the structure may become more heat-resistant and may be handled easier in the following processes. Thus, following operations may be performed more easily. As described above, the base encapsulant 116 may be formed using various molding methods.

As shown in FIG. 14, the base encapsulant 116 may be polished and planarized. The reason for polishing and planarizing the base encapsulant 116 is to secure reliability for a later operation of etching the rear surface of the base substrate 102, that is, the non-active surface 106, to reduce the thickness of the base substrate 102. However, the operation of polishing and planarizing the base encapsulant 116 shown in FIG. 14 may be omitted.

Figure 15:
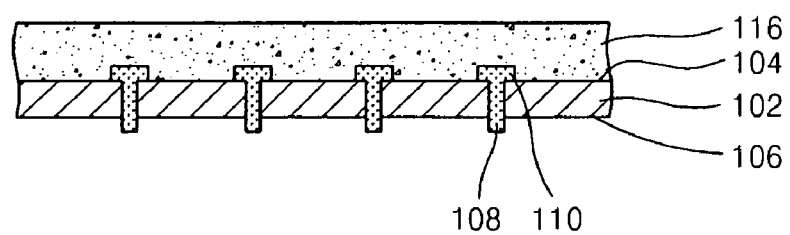

Referring to FIG. 15, the rear surface of the base substrate 102, that is, the non-active surface 106, may be etched to reduce the thickness of the base substrate 102 at the wafer level. Thus, the base through via electrode 108 may protrude from the rear surface of the base substrate 102. In FIGS. 13 through 15, break lines at left and right sides indicates that the structures shown in FIGS. 13 through 15 are at the wafer level.

Figure 16:
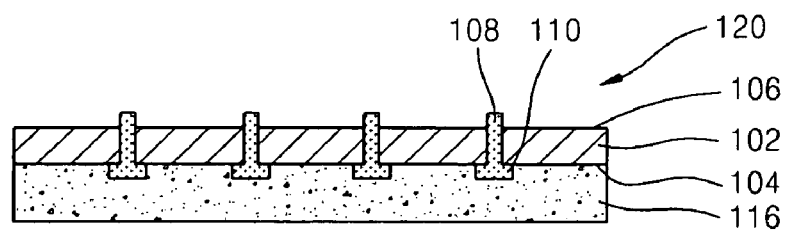

Referring to FIG. 16, the base chips 120 may be prepared by dicing the base substrate 102 and the base encapsulant 116 at the wafer level, wherein the exposed surface of base encapsulant 116 faces downward. In other words, a singulation process may be performed to form the individual base chips 120 by dicing the base substrate 102 and the base encapsulant 116 that may be formed as a wafer. In the base chip 120 of FIG. 16, the non-active surface 106 faces upward. For convenience of explanation, only one base chip 120 is shown in FIG. 16.

Figure 17:
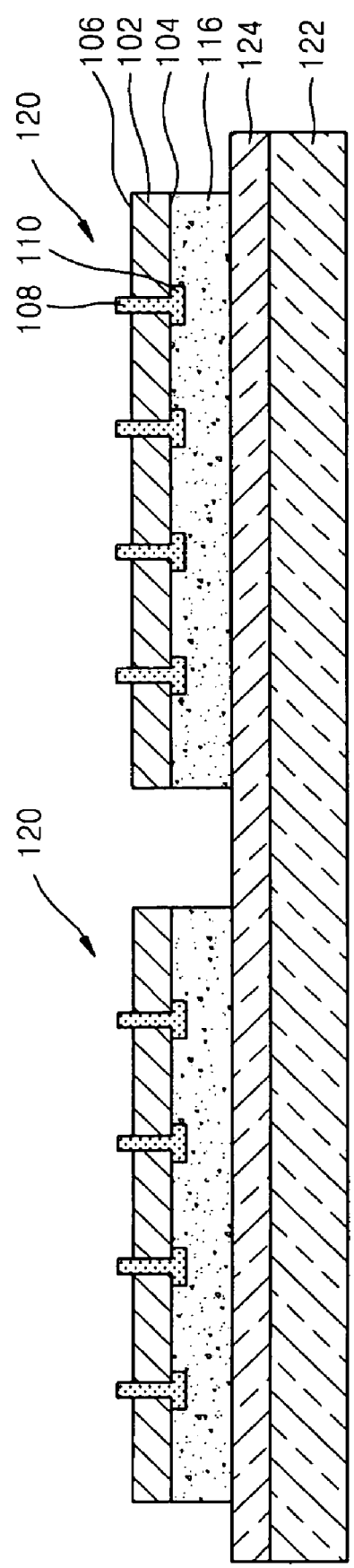

Referring to FIG. 17, a plurality of base chips 120 may be individually attached onto and reconfigured on the wafer carrier 122, wherein surfaces of the base encapsulants 116 of the base chips 120 are attached to the wafer carrier 122, and an adhesive layer 124 is interposed between the base encapsulants 116 and the wafer carrier 122. The base chips 120 are reconfigured on the wafer carrier 122, which has the same size as a wafer, so that stack chips may be easily stacked in a later operation.

Figure 18:
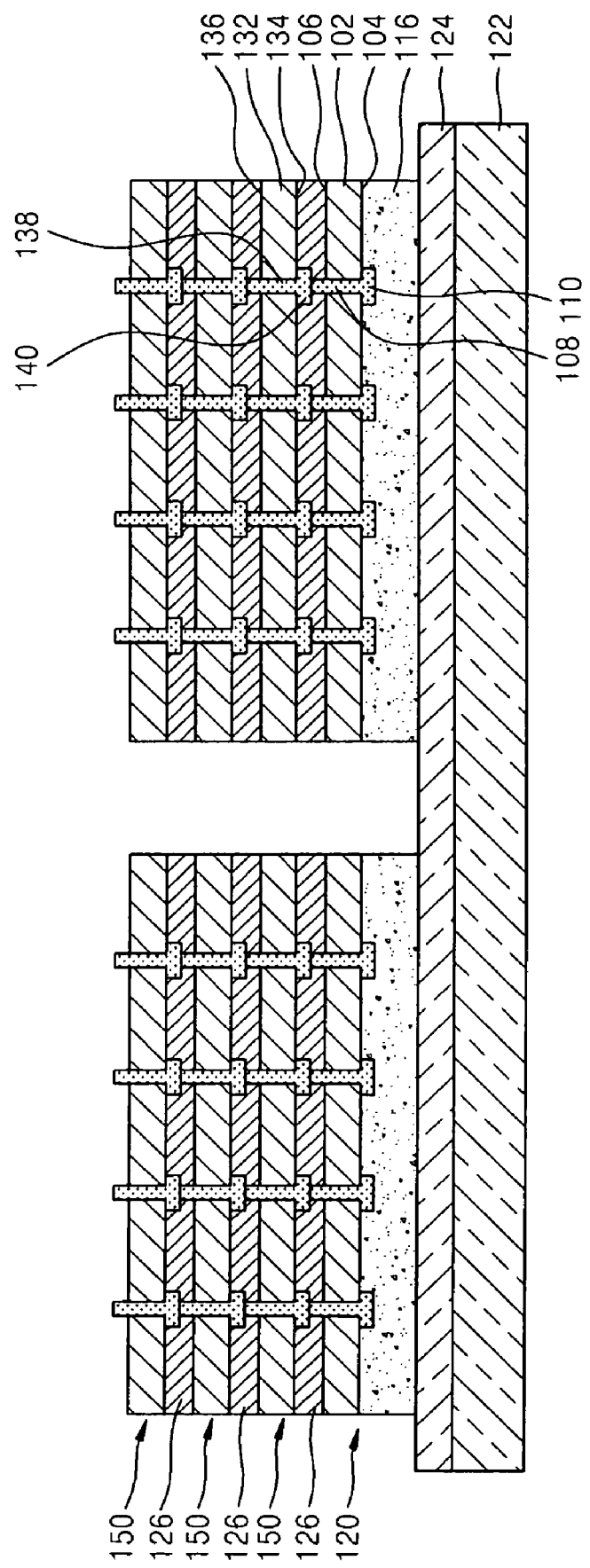

Referring to FIG. 18, the plurality of stack chips 150 may be attached to the base chips 120 reconfigured on the wafer carrier 122 at the wafer level, wherein adhesive layers 126 may be interposed between the stack chips 150 and the base chips 120. For convenience of explanation, FIG. 18 shows an example in which only three stack chips 150 are stacked on each base chip 120. The structure of the individual stack chip 150 may be identical to that shown in FIG. 10, and thus descriptions thereof will be omitted here.

Figure 19:
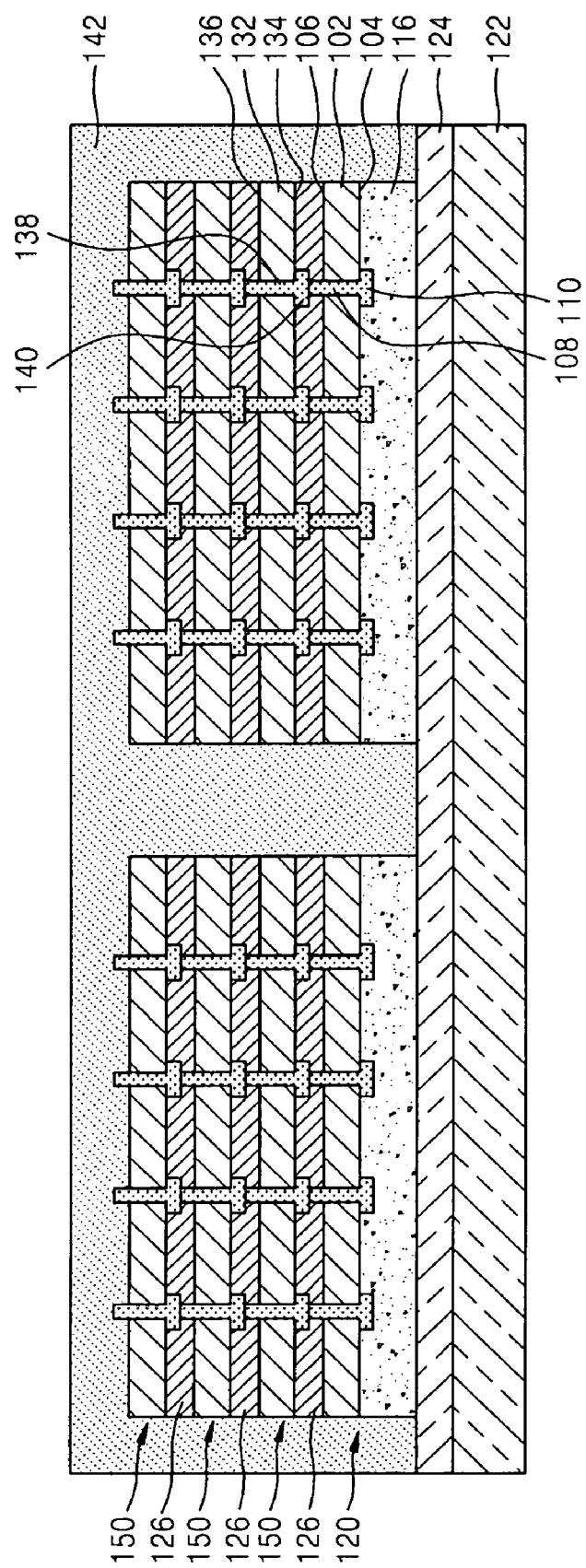

Referring to FIG. 19, the external encapsulant 142 may be formed to protect the base chip 120 and the stack chips 150 that may be formed on the wafer carrier 122. The external encapsulant 142 may be formed using various molding methods as mentioned in the above description regarding the formation of the base encapsulant 116.

Figure 20:
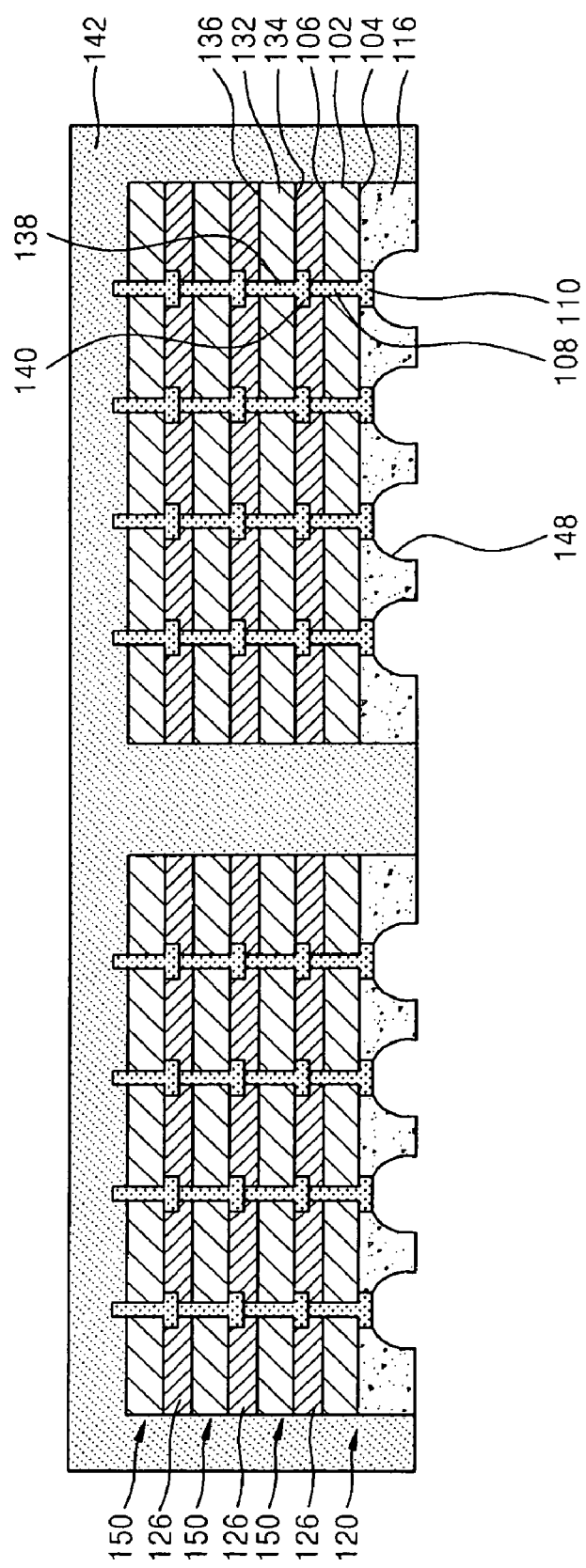

Referring to FIG. 20, the base chip 120 and the stack chips 150 which may be surrounded by the external encapsulant 142 may be removed from the wafer carrier 122 by removing the adhesive layer 124. The base encapsulant 116 may be etched until the base chip pad 110 is exposed, and thus the hole 148 may be formed. The base encapsulant 116 is etched using a physical etching method or a chemical etching method.

As shown in FIG. 2, the external connection terminal 152 may be formed by forming a solder ball that is connected to the base chip pad 110 within the hole 148 and protrudes from the base encapsulant 116. The external encapsulant 142 may be diced at the wafer level, and thus the chip stack package 200a shown in FIG. 2 may be fabricated.

Figure 21:
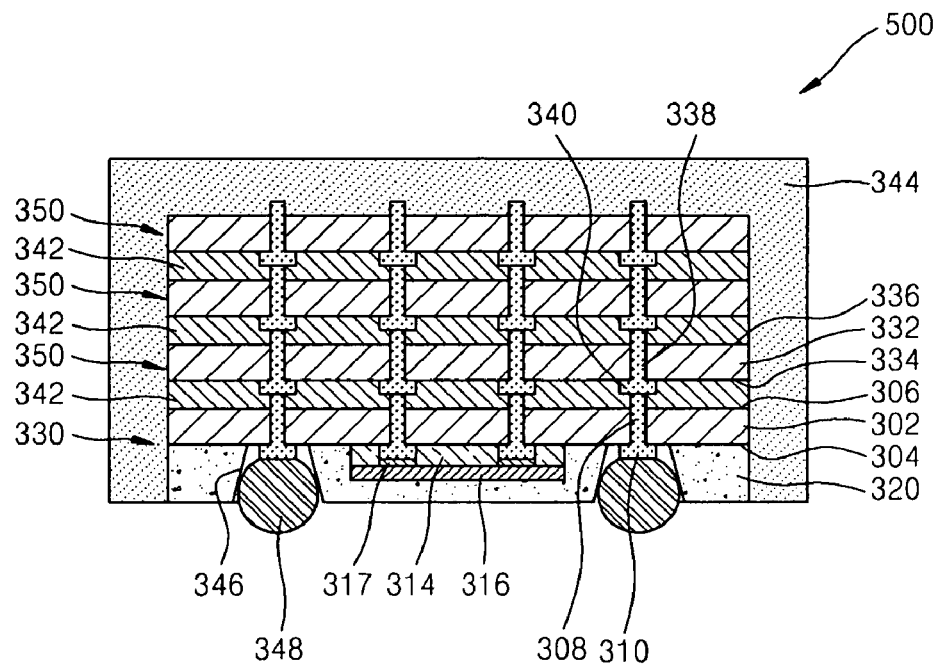

FIG. 21 is a cross-sectional view of a chip stack package 500 according to example embodiments.

Particularly, the chip stack package 500 according to example embodiments includes a base chip 330. The base chip 330 includes a base substrate 302, a base chip pad 310, a base through via electrode 308, and a base encapsulant 320. The base substrate 302 includes an active surface 304, on which an integrated circuit is to be formed, and a non-active surface 306, on which no integrated circuit is to be formed, and may be used as a wiring substrate. The base substrate 302 may be formed of a silicon substrate.

The base through via electrode 308 is formed in the base substrate 302, and the base through via electrode 308 is connected to the base chip pad 310. The base chip pad 310 and the base through via electrode 308 may be formed of metal layers, e.g., aluminium layers or copper layers. The base chip pad 310 may be a redistribution pad using a redistribution layer (not shown) formed on the base substrate 302. The chip stack package 500 further includes a heterogeneous chip 316 attached to the base chip 330. The heterogeneous chip 316 is attached onto the active surface 304 of the base substrate 302, and an adhesive layer 314 is interposed between the heterogeneous chip 316 and the active surface 304. The heterogeneous chip 316 may be a different type of chip from stack chips 350. A chip pad 317 of the heterogeneous chip 316 is electrically connected to the base chip pad 310.

The base encapsulant 320 is formed to protect a first surface of the base substrate 302, e.g., the active surface 304, and the heterogeneous chip 316. In the base chip 320, the first surface, e.g., the active surface 304, of the base substrate 302 faces downward, and the base encapsulant 320, which is formed below the base substrate 302, supports the base substrate 302. The base chip pad 310 is formed on the first surface, e.g., the active surface 304, of the base substrate 302, whereas the base through via electrode 308 is formed on and protrudes from a second surface, e.g., the non-active surface 306, of the base substrate 302.

A plurality of the stack chips 350, e.g., three stack chips 350, are attached to the second surface, e.g., the non-active surface 306, of the base substrate 302, wherein adhesive layers 342 are interposed therebetween. The individual stack chip 350 includes a substrate 332 having an active surface 334, on which an integrated circuit is to be formed, and a non-active surface 336, on which no integrated circuit is to be formed. The substrate 332 is formed of a silicon substrate. The individual stack chip 350 includes a chip through via electrode 338 that penetrates the substrate 332 and a chip pad 340 that is connected to the chip through via electrode 338.

In the individual stack chip 350, the active surface 334 faces downward and the chip pad 340 is directly connected to the base through via electrode 308 of the base chip 330. The chip pad 340 formed on a first surface, e.g., the active surface 334, of the substrate 332 is connected to the base through via electrode 308, which is formed on and protrudes from the second surface of the base substrate 330. Accordingly, the chip through via electrode 338 and the chip pad 340 are connected to the base through via electrode 330 and the base chip pad 310.

A hole 346 exposing the base chip pad 310 is formed in the base encapsulant 320. A solder ball is formed in the hole 346, and thus an external connection terminal 348 is formed. The external connection terminal 348 protrudes past the base encapsulant 320. The external connection terminal 348 is electrically connected to the base chip pad 310 exposed by the hole 346. An external encapsulant 344 that surrounds and protects the base chip 330 and the stack chips 350 is formed. The external encapsulant 343 is formed to surround the outer surfaces of the base chip 330 and the stack chips 350 but not the surface on which the base encapsulant 320 is formed.

The chip stack package 500 according to example embodiments having the structure described above may exhibit the same effects as the chip stack packages 200 and 200a. However, the chip stack package 500 according to the current embodiment includes the heterogeneous chip 316 in the base chip 320, and thus various functions can be embodied.

Figure 22:
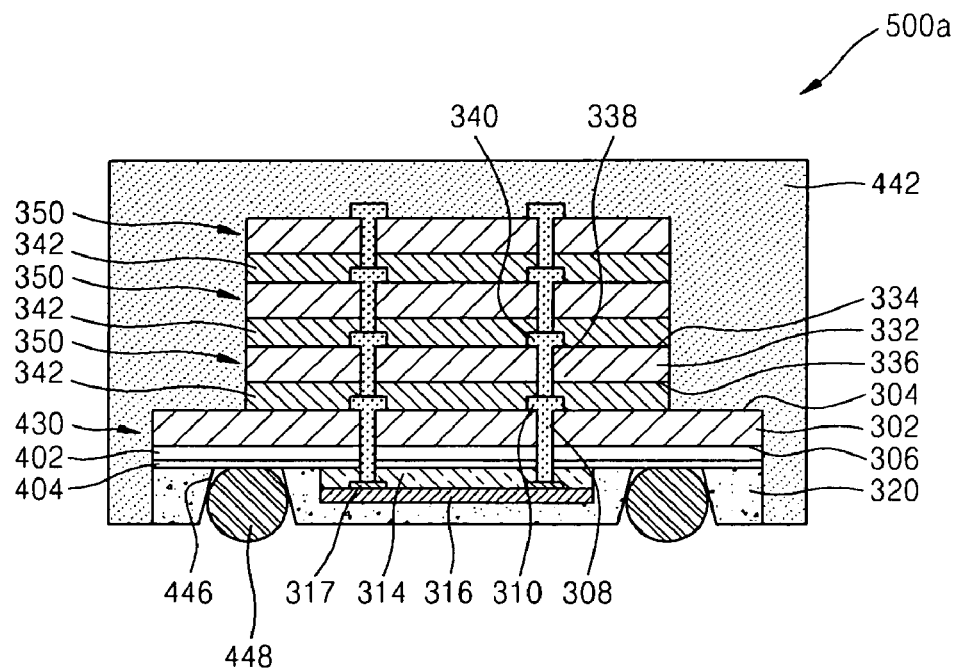

FIG. 22 is a cross-sectional view of a chip stack package 500a according to example embodiments.

Particularly, the chip stack package 500a according to the current embodiment of example embodiments is identical to the chip stack package 500 according to the previous embodiment except the structure of a base chip 430 and arrangement/connection relationship between the base chip 430 and the stack chips 350 are different from the previous embodiment.

The chip stack package 500a according to example embodiments includes the base chip 430. Unlike the previous embodiment shown in FIG. 21, the active surface 304 of the base substrate 302, which may be used as a wiring substrate, is a top surface of the base substrate 302, whereas the non-active surface 306 of the base substrate 302 is a rear surface of the base substrate 302, in the base chip 430. In other words, a second surface, e.g., the non-active surface 306, of the base chip 430 faces downward. The base chip pad 310 is formed on the first surface, e.g., the active surface 304, of the base substrate 302, whereas the base through via electrode 308 is formed on and protrudes from the second surface, e.g., the non-active surface 306, of the base substrate 302.

The chip stack package 500a further includes a heterogeneous chip 316 attached to the base chip 430. The heterogeneous chip 316 is attached onto the non-active surface 306 of the base substrate 302, and an adhesive layer 314 is interposed between the heterogeneous chip 316 and the non-active surface 306. The heterogeneous chip 316 may be a different type of chip from the stack chips 350. A chip pad 317 of the heterogeneous chip 316 is electrically connected to the base chip pad 310.

An insulation layer 402 and a redistribution layer 404 are formed on the non-active surface 306 of the base substrate 302. The redistribution layer 404 is connected to the protruding base through via electrode 308. The base encapsulant 320 is formed to protect a surface, e.g., the non-active surface 306, of the base substrate 302 and the heterogeneous chip 316.

A plurality of the stack chips 350, e.g., three stack chips 350, are attached to the first surface, e.g., the active surface 304, of the base substrate 302, wherein adhesive layers 342 are interposed therebetween. In the individual stack chip 350, the active surface 334 faces upward, and the chip through via electrode 338 is directly connected to the base chip pad 310 of the base chip 430. In other words, the chip through via electrode 338 formed on the second surface, e.g., the non-active surface 336, of the substrate 332 is connected to the base chip pad 310 formed on the first surface of the base substrate 302. Accordingly, the chip through via electrode 338 and the chip pad 340 are connected to the base through via electrode 308 and the base chip pad 310.

A hole 446 exposing the redistribution layer 404 may be formed in the base encapsulant 320. A solder ball may be formed in the hole 446, and thus an external connection terminal 448 may be formed. The external connection terminal 448 may protrude from the base encapsulant 320. An external encapsulant 442 that surrounds and protects the base chip 430 and the stack chips 350 may be formed. The external encapsulant 442 is formed to surround the outer surfaces of the base chip 430 and the stack chips 350 but not the surface on which the base encapsulant 320 is formed.

The chip stack package 500a having the structure described above may exhibit the same effects as the chip stack packages 200, 200a, and 500a.

FIGS. 23 through 29 are cross-sectional views of a method of fabricating a chip stack package 500 as shown in FIG. 21.

Figure 23:
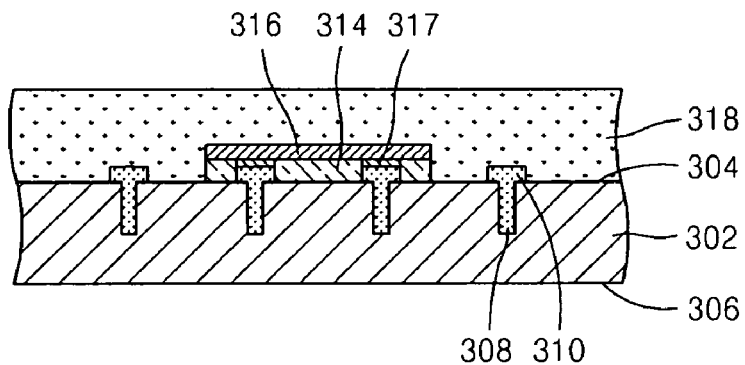

Referring to FIG. 23, the base substrate 302 having the active surface 304, on which an integrated circuit may be formed, and the non-active surface 306, on which no integrated surface is to be formed, may be prepared. FIG. 23 shows the base substrate 302 at the wafer level. The base substrate 302 may be formed of a silicon substrate, that is, a silicon wafer. The base through via electrode 308 and the base chip pad 310 connected to the base through via electrode 308 may be formed in the base substrate 302. In FIG. 23, the base through via electrode 308 only partially penetrates the base substrate 302, and will completely penetrate the base substrate 302 in another operation. The base through via electrode 308 may be formed of a metal layer, e.g., an aluminium layer or a copper layer.

The base chip pad 310 may be either simultaneously formed with the base through via electrode 308 or not formed simultaneously with the base through via electrode 308. Similar to the base through via electrode 308, the base chip pad 310 may also formed of a metal layer, e.g., an aluminium layer or a copper layer. The base chip pad 310 may be a redistribution pad using a redistribution layer (not shown) formed on the base substrate 302.

The heterogeneous chip 316, which may be a different type of chip from stack chips that may be stacked in another operation, may be attached to the active surface 304 of the base substrate 302, and the adhesive layer 314 may be interposed between the heterogeneous chip 316 and the active surface 304. The heterogeneous chip 316 may be smaller than the stack chips that are to be stacked later. A wafer supporting structure 318 may be attached to the heterogeneous chip 316, the base substrate 302, and the active surface 304 of the base substrate 302 on which the base chip pad 310 is formed. The wafer supporting structure 318 may be formed and used when the rear surface of the base substrate 302, that is, the non-active surface 306, is etched to reduce the thickness of the base substrate 302 in another operation. The wafer supporting structure 318 may be formed of a glass panel, for example.

Figure 24:
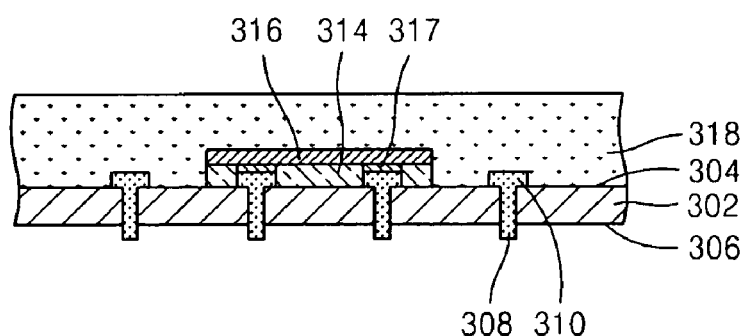

Referring to FIG. 24, using the wafer supporting structure 318 as a supporter, the rear surface of the base substrate 302, that is, the non-active surface 306 may be etched to reduce the thickness of the base substrate 302 at the wafer level. Thus, the base through via electrode 308 may protrude from the rear surface of the base substrate 302.

Figure 25:
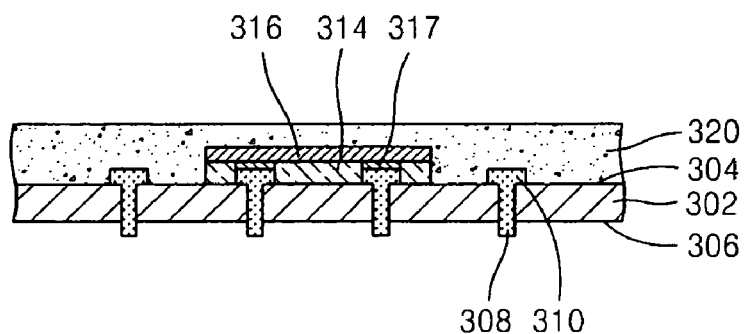

Referring to FIG. 25, the wafer supporting structure 318 is removed, and the base encapsulant 320, which may protect the heterogeneous chip 316, the base substrate 302 and the base chip pad 310, is formed. In cases where the base encapsulant 320 is formed, the structure may become more heat-resistant and may be handled easier in the following processes. Thus, following operations may be performed more easily. When the base encapsulant 320 is formed, a heat-resistant tape (not shown) may be formed on the rear surface of the base substrate 302, that is, the non-active surface 306, from which the through via electrode 308 may protrude.

The base encapsulant 320 may be formed using various molding methods, e.g., a method of injecting liquefied resin into a mold and solidifying the liquefied resin, a method of laminating film type resin and solidifying the film type resin, or a method of spraying resin and solidifying the sprayed resin.

Figure 26:
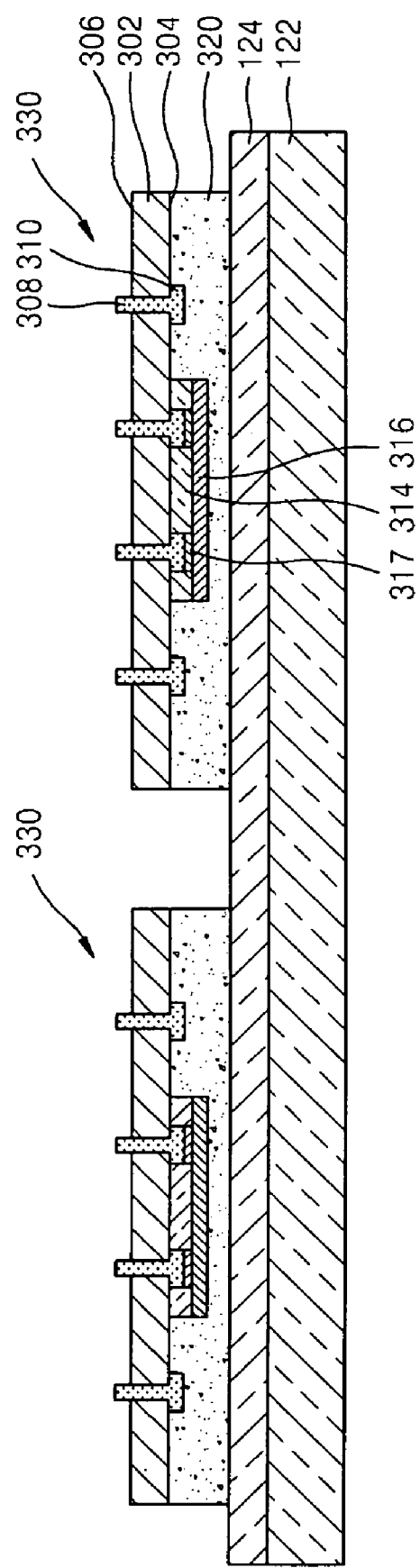

Referring to FIG. 26, a plurality of the base chips 330 may be prepared by dicing the base substrate 302 and the base encapsulant 320 at the wafer level, wherein the base encapsulant 320 faces downward. In other words, a singulation process of forming the individual base chips 330 by dicing the base substrate 302 and the base encapsulant 320 that may be formed as a wafer may be performed. As compared to the individual base chips 120 shown in FIGS. 1 and 2, the individual base chip 330 may further include the heterogeneous chip 316.

The plurality of base chips 330 may be individually attached onto and reconfigured on the wafer carrier 122, wherein surfaces of the base encapsulants 320 of the base chips 330 are attached to the wafer carrier 122, and the adhesive layer 124 may be interposed between the base encapsulants 320 and the wafer carrier 122. The base chips 330 are reconfigured on the wafer carrier 122, which may have the same size as a wafer, so that stack chips can be easily stacked in another operation.

Figure 27:
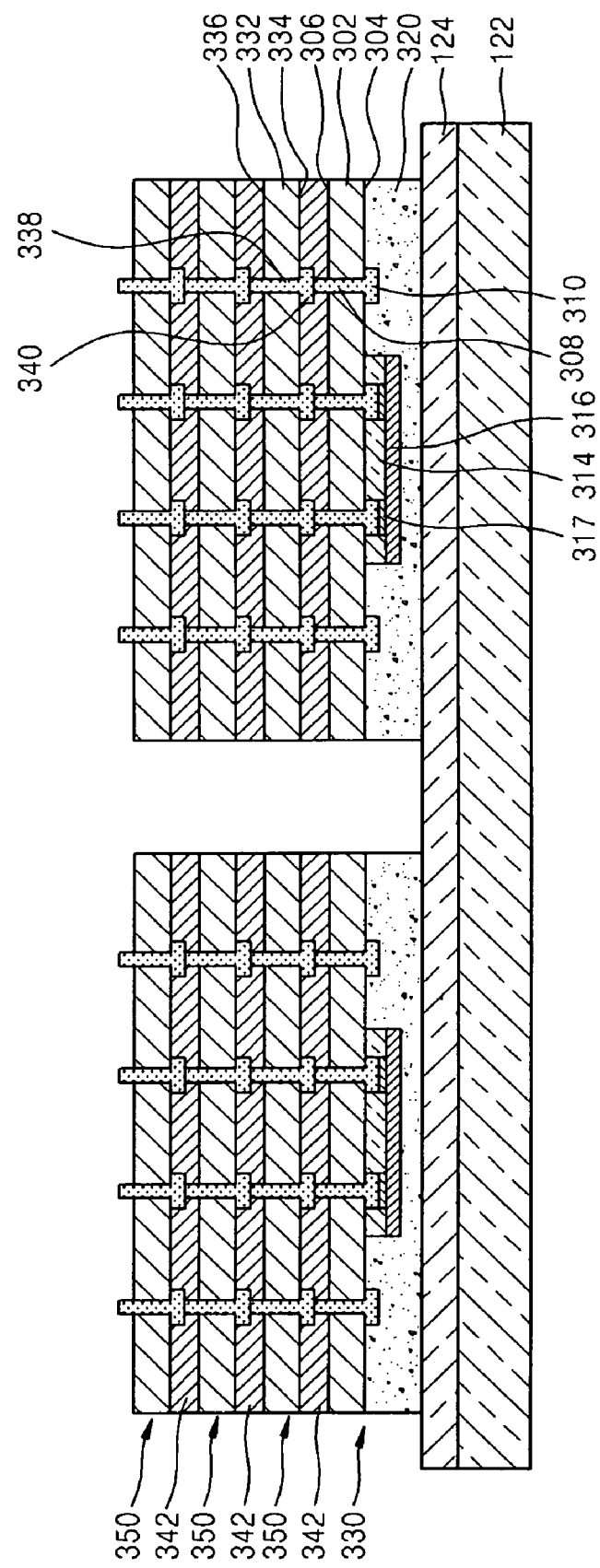

Referring to FIG. 27, the plurality of stack chips 350 may be attached to the base chips 330 reconfigured on the wafer carrier 122 at the wafer level, wherein adhesive layers 342 may be interposed between the stack chips 350 and the base chips 330 and between the stack chips 350. For convenience of explanation, FIG. 27 shows an example in which only three stack chips 350 are stacked on each base chip 120.

The individual stack chip 350 may include the chip pad 340 and the chip through via electrode 338, which may penetrate the substrate 332 and is connected to the chip pad 340. The substrate 332 constituting the individual stack chip 350 includes the active surface 334, on which an integrated circuit may be formed, and the non-active surface 336, on which no integrated circuit is to be formed. In the stack chips 350, the chip pad 340 may be formed on the active surface 334 of the substrate 332, and the chip through via electrode 338 may be formed to protrude from the non-active surface 336.

Therefore, as described above, when the stack chips 350 are stacked on the wafer carrier 122, the base through via electrode 308 of the base chip 330 and the chip pad 340 of the stack chips 350 may be connected. In other words, the individual stack chip 350 may include the chip pad 340 connected to the base through via electrode 308, and may include the chip though via electrode 338 connected to the chip pad 340.

Figure 28:
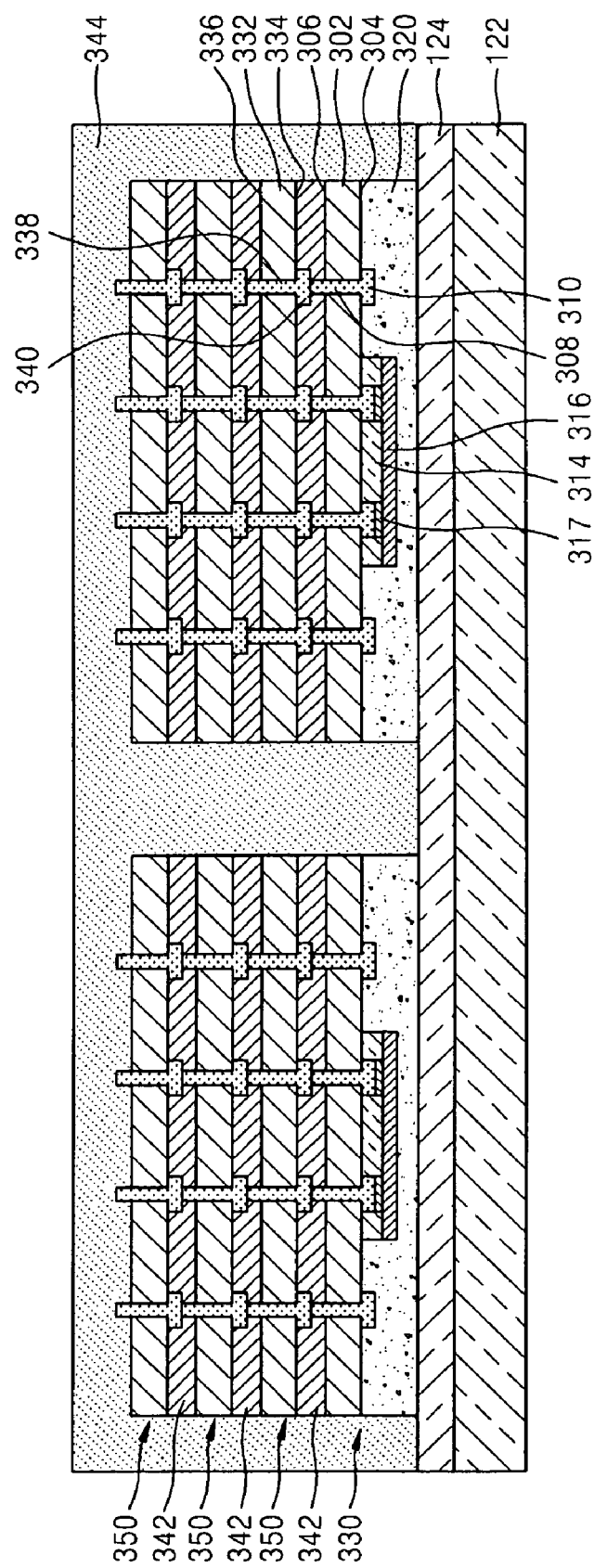

Referring to FIG. 28, the external encapsulant 344 may be formed to protect the base chip 330 and the stack chips 350 that may be formed on the wafer carrier 122. The external encapsulant 344 may be formed using various molding methods as mentioned in the above description regarding the formation of the base encapsulant 320.

Figure 29:
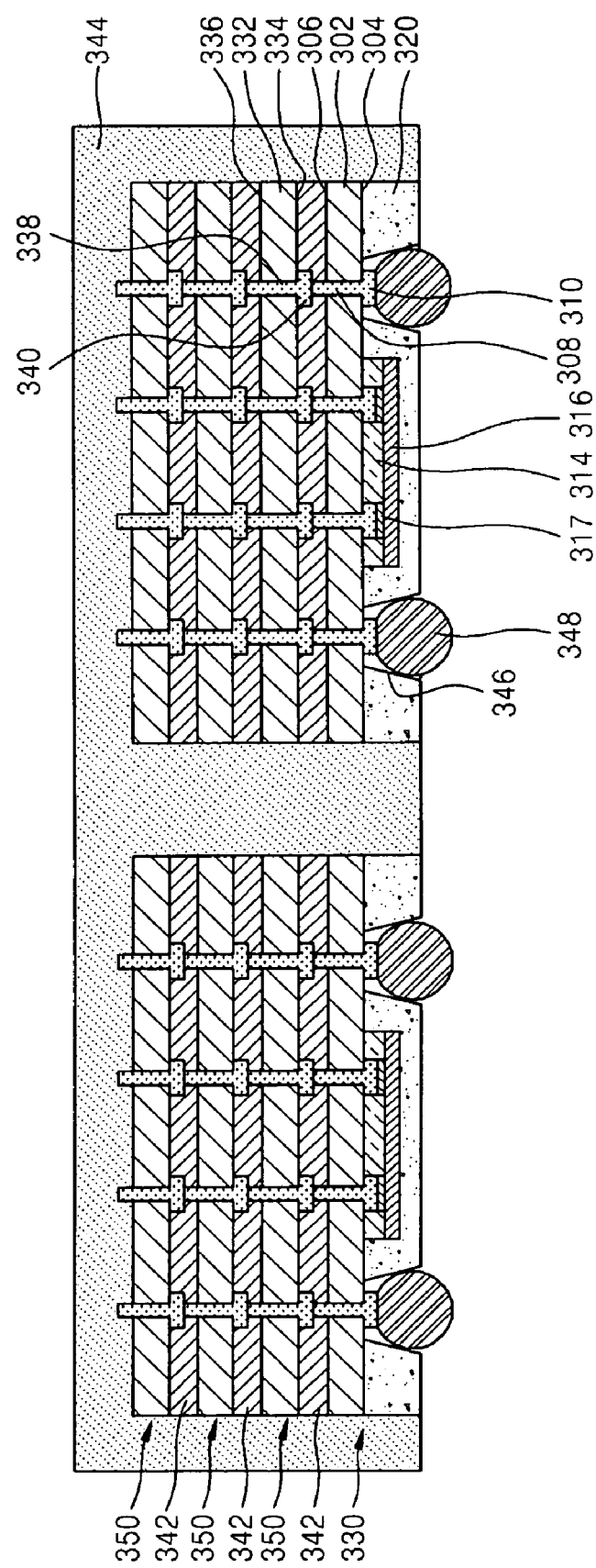

Referring to FIG. 29, the base chip 330 and the stack chips 350 which may be surrounded by the external encapsulant 344 may be removed from the wafer carrier 122 by removing the adhesive layer 124. The base encapsulant 320 may be etched at the wafer level to form a hole 346 that may expose the base chip pad 310. The base encapsulant 320 may be etched using a physical etching method or a chemical etching method.

The external connection terminal 348, which may be connected to the base chip pad 310 exposed by the hole 346, may be formed by forming a solder ball in the hole 346. As shown in FIG. 21, the external encapsulant 344 may be diced at the wafer level, and thus the chip stack package 500 may be fabricated.

FIGS. 30 through 36 are cross-sectional views of a method of fabricating the chip stack package 500a as shown in FIG. 22.

Figure 30:
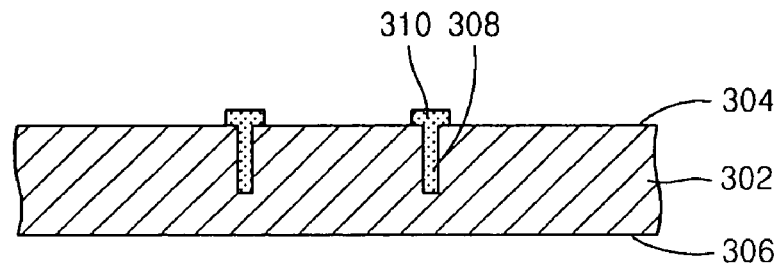

Referring to FIG. 30, the base substrate 302 having the active surface 304, on which an integrated circuit may be formed, and the non-active surface 306, on which no integrated surface is to be formed, may be prepared, as described above in reference to FIG. 23. FIG. 30 shows the base substrate 302 at the wafer level. The base substrate 302 may be formed of a silicon substrate, that is, a silicon wafer.

The base through via electrode 308 and the base chip pad 310 connected to the base through via electrode 308 may be formed in the base substrate 302. In FIG. 30, only two of the base through via electrodes 308 and two of the base chip pads 310 are formed at or near the center of the base substrate 302. The base through via electrode 308 may be formed of a metal layer, e.g., an aluminium layer or a copper layer. The base chip pad 310 may be a redistribution pad using a redistribution layer (not shown) formed on the base substrate 302.

Figure 31:
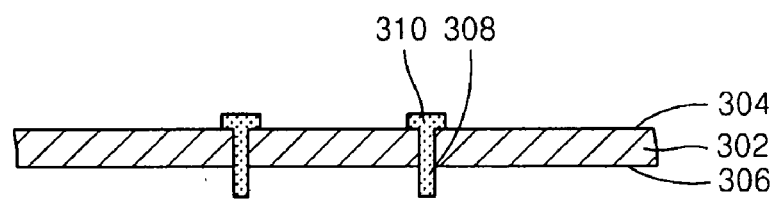

Referring to FIG. 31, the rear surface of the base substrate 302, that is, the non-active surface 306 may be etched to reduce the thickness of the base substrate 302 at the wafer level. Thus, the base through via electrode 308 may protrude from the rear surface of the base substrate 302.

Figure 32:
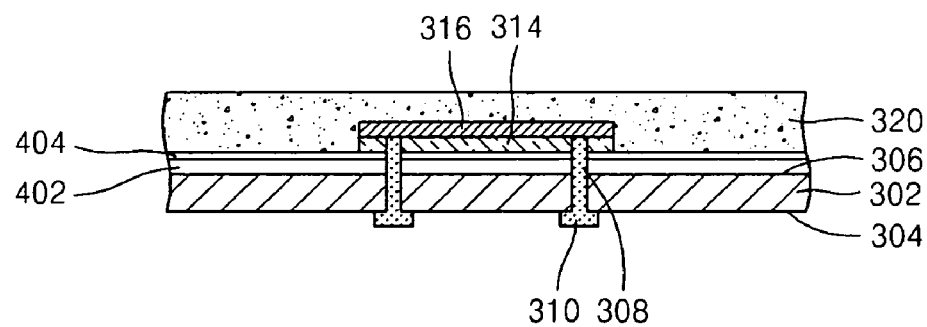

Referring to FIG. 32, the base substrate 302 may be flipped over and the insulation layer 402 and the redistribution layer 404 may be formed on the non-active surface 306 of the base substrate 302. When the redistribution layer 404 is formed, a heat-resistant tape (not shown) may be formed on the surface of the base substrate 302 on which the base chip pad 310 is formed. The redistribution layer 404 may be formed of a metal layer, e.g., aluminium layer or copper layer. The heterogeneous chip 316, which may be a different type of chip from stack chips that are to be stacked in another operation, may be attached onto the non-active surface 306 of the base substrate 302, and the adhesive layer 314 may be interposed between the heterogeneous chip 316 and the non-active surface 306.

The base encapsulant 320, which may protect the heterogeneous chip 316, the base substrate 302, and the base chip 310, may be formed. The base encapsulant 320 may be formed using various molding methods, e.g., a method of injecting liquefied resin into a mold and solidifying the liquefied resin, a method of laminating film type resin and solidifying the film type resin, or a method of spraying resin and solidifying the sprayed resin. In FIGS. 30 through 32, break lines at left and right sides indicates that the structures shown in FIGS. 30 through 32 are at the wafer level.

Figure 33:
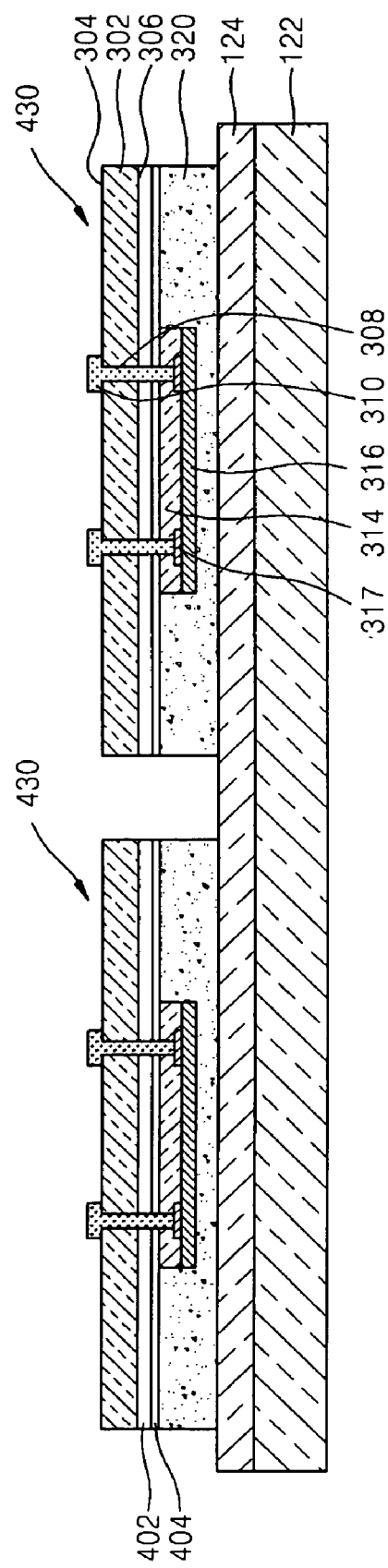

Referring to FIG. 33, a plurality of the base chips 430 are prepared by dicing the base substrate 302 and the base encapsulant 320 at the wafer level, wherein the exposed surface of the base encapsulant 320 faces downward. As compared to the individual base chips 120 shown in FIGS. 1 and 2, the individual base chip 430 further includes the heterogeneous chip 316. In the base chip 430, the active surface 304 of the base substrate 302 faces upward.

The plurality of base chips 430 may be individually attached to and reconfigured on a wafer carrier 122, wherein the surfaces of the base encapsulants 320 of the base chips 430 are attached to the wafer carrier 122, and the adhesive layer 124 may be interposed between the base encapsulants 320 and the wafer carrier 122. The base chips 430 may be reconfigured on the wafer carrier 122, which may have the same size as a wafer, so that stack chips may be easily stacked in another operation.

Figure 34:
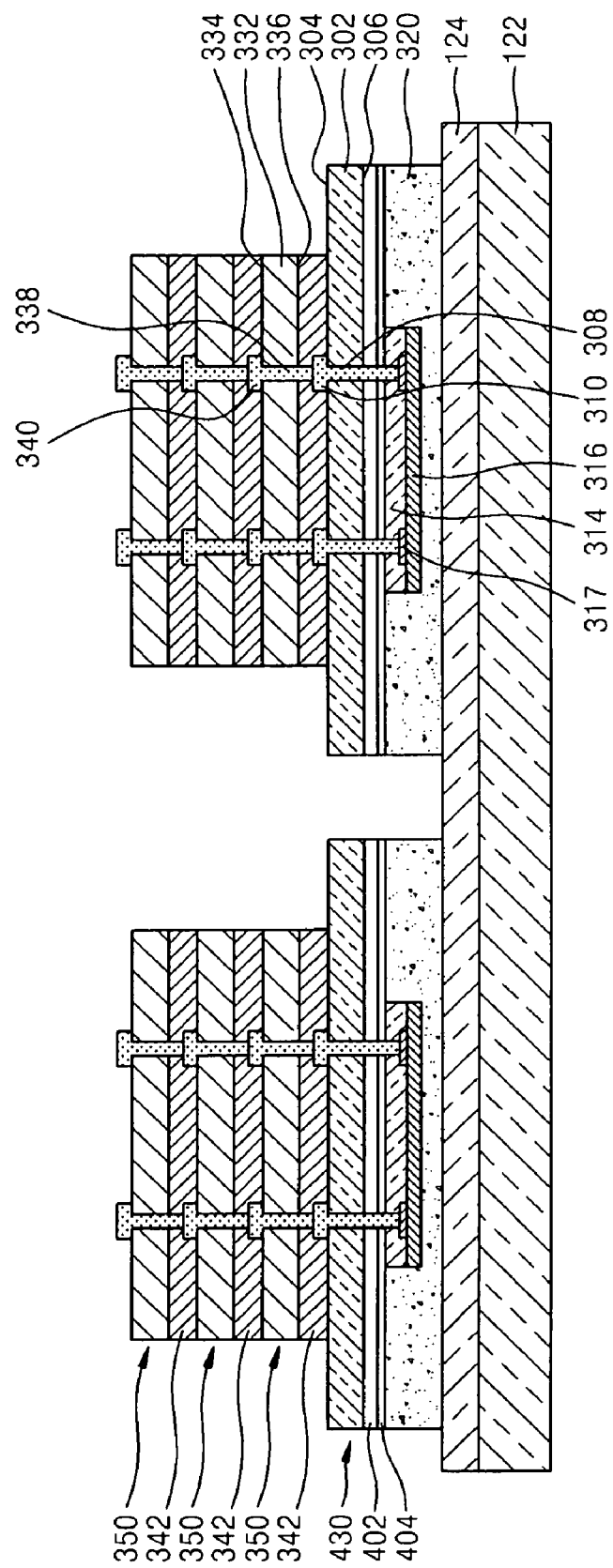

Referring to FIG. 34, the plurality of stack chips 350 may be attached to the base chips 430 reconfigured on the wafer carrier 122 at the wafer level, wherein adhesive layers 342 are interposed between the stack chips 350 and the base chips 430. For convenience of explanation, FIG. 34 shows an example in which only three stack chips 350 are stacked on each base chip 430.

As described above, the individual stack chip 350 may include the substrate 332 having the active surface 334, on which an integrated circuit may be formed, and the non-active surface 336, on which no integrated circuit is to be formed, the chip pad 340, and the chip through via electrode 338. When the stack chips 350 are stacked on the wafer carrier 122, the stack chips 350 may be stacked such that the non-active surfaces 336 face downward. Thus, the base chip pad 310 of the base chip 430 and the chip through via electrode 338 of the stack chip 350 may be connected. In other words, the individual stack chip 350 may include a chip though via electrode 338 connected to the base chip pad 310 and the chip pad 340.

Figure 35:
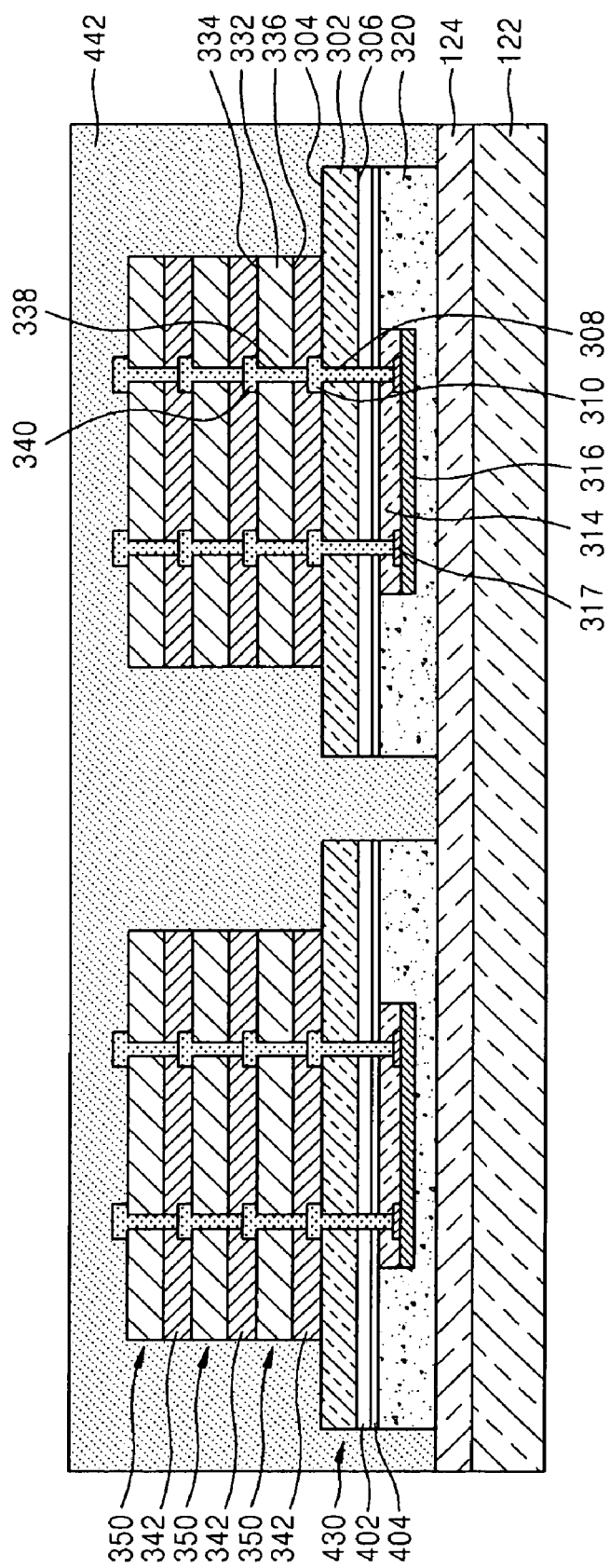

Referring to FIG. 35, the external encapsulant 442 may be formed to protect the base chip 430 and the stack chips 350 that may be formed on the wafer carrier 122. The external encapsulant 442 may be formed using various molding methods as mentioned in the above description regarding the formation of the base encapsulant 320.

Figure 36:
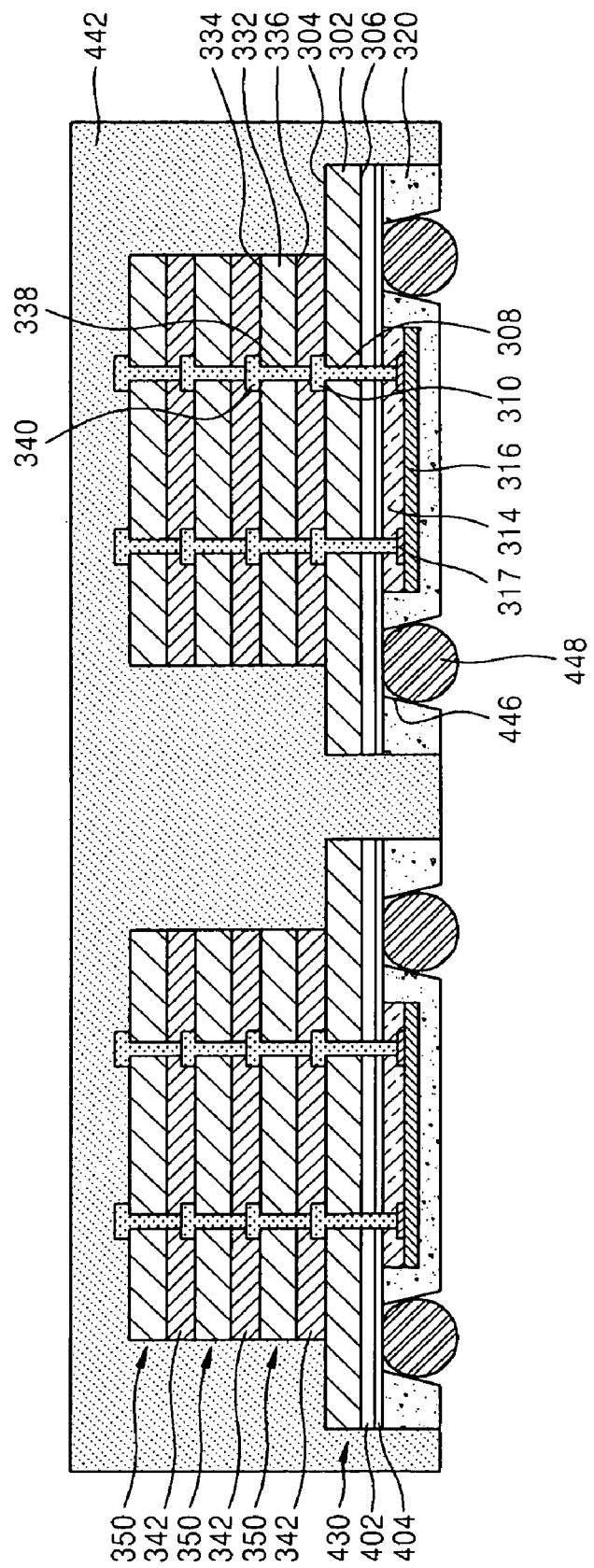

Referring to FIG. 36, the base chip 430 and the stack chips 350 which are surrounded by the external encapsulant 442 may be removed from the wafer carrier 122 by removing the adhesive layer 124. The base encapsulant 320 may be etched at the wafer level to form the hole 446 that may expose the redistribution layer 404. The external connection terminal 448 may be formed by forming a solder ball in the hole 446. The external connection terminal 448 may be connected to the base chip pad 310 of the base chip 430 via the redistribution layer 404. As shown in FIG. 22, the external encapsulant 442 may be diced at the wafer level, and thus the chip stack package 500a may be fabricated.

Figure 37:
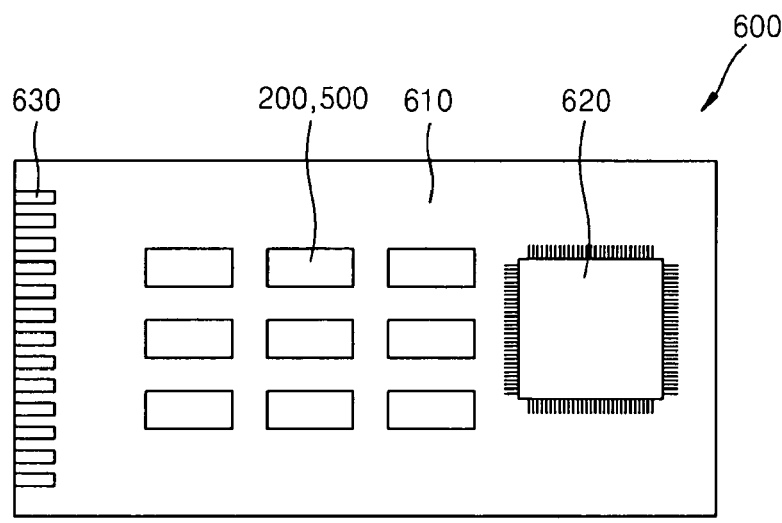
Figure 38:
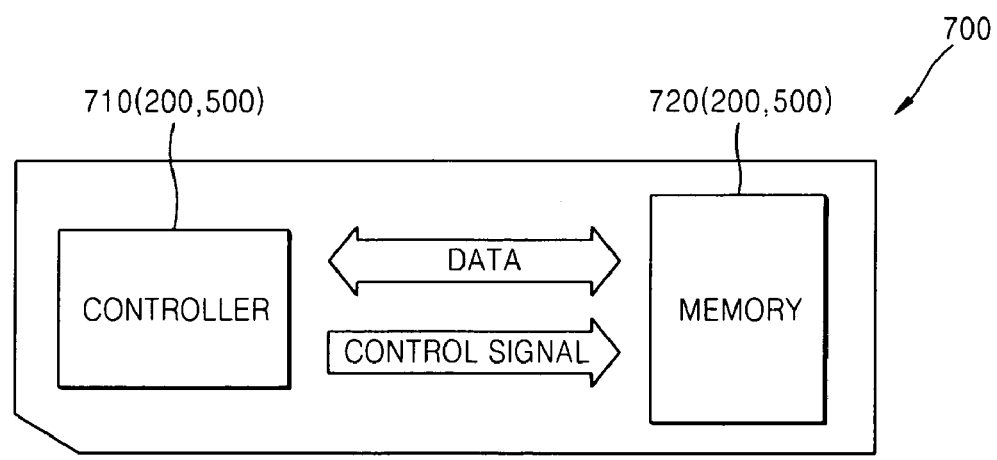
Figure 39:
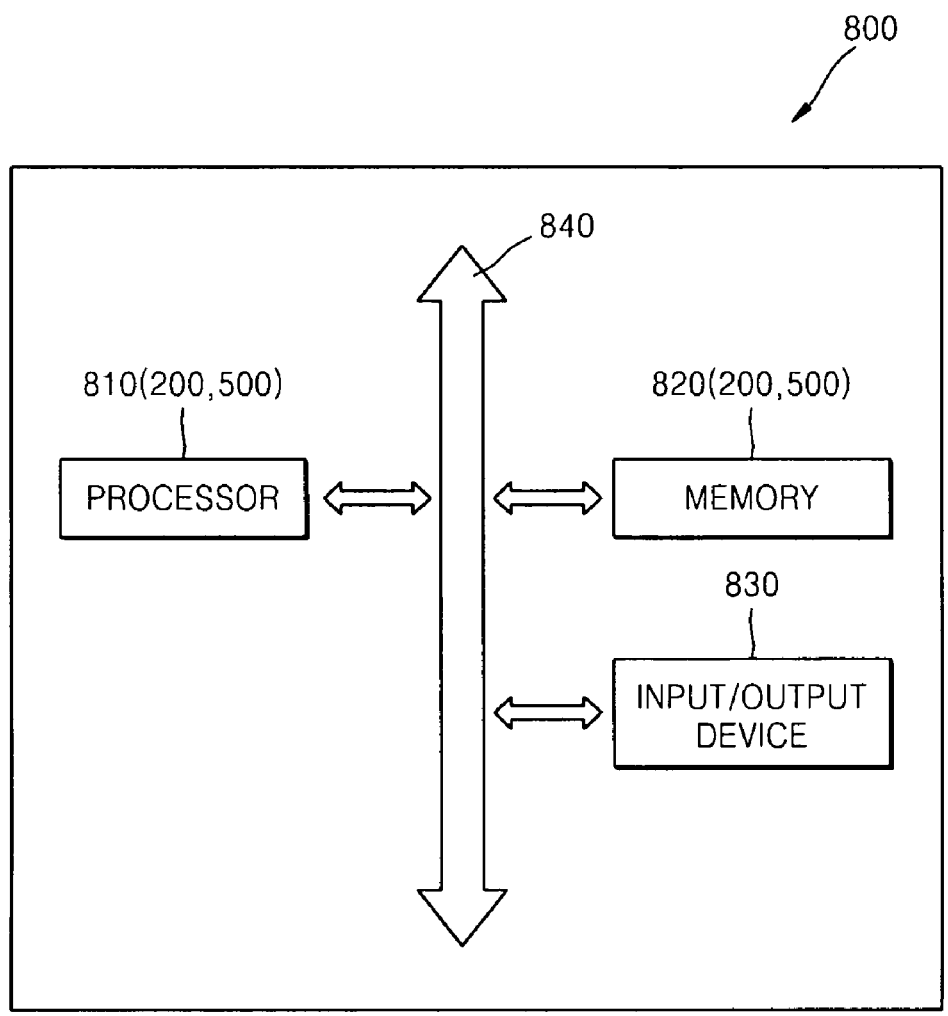

Various applications using the chip stack packages 200, 200a, 500, and 500a according to example embodiments will be described below. Although there may be a number of applications, only a few of them will be described herein. In FIGS. 37 through 39, chip stack packages according to example embodiments will be indicated as reference numerals 200 and 500.

FIG. 37 is a concept view showing the configuration of a package module using a chip stack package according to example embodiments.

More particularly, the chip stack package 200 or 500 according to example embodiments may be used in a package module 600. In the package module 600, a plurality of the chip stack packages 200 or 500 may be attached to a module substrate 610. A package 620 may be attached to an end of the package module 600, and an external connection terminal 630 may be attached to another end of the package module 600. The chip stack package 200 or 500 according to example embodiments may be applied to various package modules, and not limited to the package module 600 shown in FIG. 37.

FIG. 38 is a concept view showing the configuration of a card using a chip stack package according to example embodiments.

Particularly, the chip stack package 200 or 500 according to example embodiments may be applied to a card 700. Examples of the card 700 include a multimedia card (MMC) and a secure digital (SD) card. The card 700 may include a controller 710 and a memory 720. The memory 720 may, for example, be a flash memory, a phase change random access memory (PRAM), or a non-volatile memory. The controller 710 may transmit a control signal to the memory 720, and the controller 710 and the memory 720 may send data to and receive data from each other.

The chip stack package 200 or 500 according to example embodiments described above may be used as the controller 710 and the memory 720 constituting the card 700. In example embodiments, the card 700 may have large memory capacity and may have a controller that is multi-functional. Furthermore, the thickness of the card 700 and the length of wirings in the card 700 may be reduced, and thus overall performance may be improved.

FIG. 39 is a concept view of an electronic system using a chip stack package according to example embodiments.

Particularly, examples of an electronic system 800 according to example embodiments include a computer, a mobile phone, a MPEG Audio Layer-3 (MP3) player, and a navigator. The electronic system 800 according to example embodiments may include a processor 810, a memory 820, and an input/output device 830. The processor 801, the memory 820, and the input/output device 830 may send and receive control signals or data to/from each other via a communication channel 840.

The electronic system 800 according to example embodiments may employ the chip stack package 200 or 500 to the processor 810 and the memory 820. Thus, the electronic system 800 may embody various functions, and reliability of the electronic system 800 may be improved.

Because a chip stack package according to example embodiments does not use a PCB substrate as a wiring substrate, the thickness of the chip stack package and the cost of fabricating the chip stack package may be reduced.

Because a chip stack package according to example embodiments is not formed by stacking chips on a PCB substrate, deterioration of performance due to relatively long length of wirings in a PCB substrate or a relatively high moisture absorption rate of a PCB substrate may be avoided.

Furthermore, because a chip stack package according to example embodiments is not formed by stacking chips on a PCB substrate, defects of the chip stack package due to a defect of a PCB substrate may be avoided.

While example embodiments have been particularly shown and described with reference to example embodiments thereof, it will be understood by those of ordinary skill in the art that various changes in form and details may be made therein without departing from the spirit and scope of the following claims.

What is claimed is:

1. A chip stack package comprising:
 a base chip including
  a base substrate,
  a base through via electrode penetrating the base substrate,
  a base chip pad connected to the base through via electrode, and
  a base encapsulant directly on a first surface of the base substrate;
 at least one stack chip on a second surface of the base substrate, the at least one stack chip including
  a substrate,
  a chip through via electrode penetrating the substrate, and
  a chip pad connected to the chip through via electrode;
 an adhesive layer between the at least one stack chip and the second surface of the base substrate;
 an external connection terminal connected to the base through via electrode and the base chip pad and protruding from the base encapsulant; and
 an external encapsulant on outer surfaces of the base chip and the at least one stack chip, wherein the chip through via electrode and the chip pad are connected to the base through via electrode and the base chip pad of the base chip.

2. The chip stack package of claim 1, further comprising:
 a second chip attached to the first surface of the base substrate, wherein the second chip and the at least one stack chip are different types of chips, and the base encapsulant is configured to protect the heterogeneous chip.

3. The chip stack package of claim 1, wherein the external connection terminal includes a first external connection terminal in the base encapsulant and a second external connection terminal connected to the first external connection terminal, the second external connection terminal protruding from the base encapsulant.

4. The chip stack package of claim 1, wherein the base substrate and the substrate are silicon substrates with integrated circuits.

5. The chip stack package of claim 1, wherein the base chip pad is a redistribution chip pad.

6. The chip stack package of claim 1, wherein the base chip pad is on the first surface of the base substrate and the base through via electrode protrudes from the second surface of the base substrate.

7. The chip stack package of claim 6, wherein the chip pad of the at least one stack chip is on a first surface of the substrate, and the chip pad on the first surface of the substrate is connected to the base through via electrode protruding from the second surface of the base substrate.

8. The chip stack package of claim 1, wherein the base chip pad is on the second surface of the base substrate and the base through via electrode protrudes from the first surface of the base substrate.

9. The chip stack package of claim 8, wherein the chip pad of the at least one stack chip is on a first surface of the substrate, and the chip pad on the first surface of the substrate is connected to the base chip pad on the second surface of the base substrate.

10. The chip stack package of claim 8, further comprising:
 a redistribution layer on the first surface of the base substrate, the redistribution layer being connected to the base through via electrode and the external connection terminal.

11. The chip stack package of claim 1, wherein the base encapsulant includes a hole exposing the base chip pad and the external connection terminal is in the hole.

12. The chip stack package of claim 1, wherein
 the first surface of the base substrate is an active surface, the second surface of the base substrate is a non-active surface, and the base chip is on the active surface, and the chip pad of the at least one stack chip is on an active surface of the substrate of the at least one stack chip.

13. The chip stack package of claim 12, further comprising:
a second chip attached to the active surface of the base substrate, wherein the second chip is a different type of chip from the at least one stack chip and the base encapsulant is configured to protect the heterogeneous chip.

14. The chip stack package of claim 1, wherein the base substrate is a wiring substrate.

15. The chip stack package of claim 1, wherein the adhesive layer is in direct contact with a first surface of the stack chip.

* * * * *